(12) United States Patent
Foust et al.

(10) Patent No.: US 9,231,134 B2
(45) Date of Patent: Jan. 5, 2016

(54) PHOTOVOLTAIC DEVICES

(75) Inventors: Donald Franklin Foust, Glenville, NY (US); Hongbo Cao, Cohoes, NY (US); Laura Anne Clark, Brighton, CO (US); Robert Andrew Garber, Denver, CO (US); Scott Daniel Feldman-Peabody, Golden, CO (US); Wyatt Keith Metzger, Louisville, CO (US); Yinghui Shan, Cohoes, NY (US); Roman Shuba, Albany, CA (US)

(73) Assignee: First Solar, Inc., Tempe, AZ (US)

( * ) Notice: Subject to any disclaimer, the term of this patent is extended or adjusted under 35 U.S.C. 154(b) by 436 days.

(21) Appl. No.: 13/601,162

(22) Filed: Aug. 31, 2012

(65) Prior Publication Data

US 2014/0060635 A1  Mar. 6, 2014

(51) Int. Cl.
*H01L 31/042* (2014.01)
*H01L 31/0296* (2006.01)
*H01L 31/0392* (2006.01)
*H01L 31/073* (2012.01)

(52) U.S. Cl.
CPC .... *H01L 31/02963* (2013.01); *H01L 31/03925* (2013.01); *H01L 31/073* (2013.01); *Y02E 10/543* (2013.01)

(58) Field of Classification Search
CPC ........ H01L 31/00–31/078; Y02E 10/50–10/60
USPC ................................. 136/243–265
See application file for complete search history.

(56) References Cited

U.S. PATENT DOCUMENTS

| 4,319,069 | A | 3/1982 | Tyan |
| 4,456,630 | A | 6/1984 | Basol |
| 6,129,779 | A | 10/2000 | Bohland et al. |
| 8,039,290 | B2 | 10/2011 | Feldman-Peabody et al. |
| 2009/0235986 | A1 | 9/2009 | Hotz et al. |
| 2010/0189612 | A1 | 7/2010 | Fthenakis et al. |
| 2010/0243039 | A1* | 9/2010 | Korevaar et al. ............ 136/255 |
| 2011/0117696 | A1 | 5/2011 | Fisher |
| 2011/0139240 | A1 | 6/2011 | Allenic et al. |
| 2011/0259423 | A1* | 10/2011 | Korevaar et al. ............ 136/260 |
| 2011/0284065 | A1* | 11/2011 | Basol ......................... 136/256 |

(Continued)

FOREIGN PATENT DOCUMENTS

| EP | 0045195 B1 | 9/1985 |
| GB | 787935 A | 12/1957 |
| WO | 2011137268 A1 | 11/2011 |

OTHER PUBLICATIONS

Marin et al., Surface Evolution of n-Type CdTe in Acidic Medium in the Presence of Ce4+ Ions, The Journal of Physical Chemistry, 1995, vol. 99(41), pp. 15198-15207.

(Continued)

*Primary Examiner* — Bach Dinh
(74) *Attorney, Agent, or Firm* — MacMillan, Sobanski & Todd, LLC

(57) ABSTRACT

Photovoltaic devices are presented. A photovoltaic device includes a window layer and a semiconductor layer including a semiconductor material disposed on window layer. The semiconductor layer includes a first region and a second region, the first region disposed proximate to the window layer, and the second region including a chalcogen-rich region, wherein the first region and the second region include a dopant, and an average atomic concentration of the dopant in the second region is greater than an average atomic concentration of the dopant in the first region.

25 Claims, 20 Drawing Sheets

(56) References Cited

U.S. PATENT DOCUMENTS

| | | |
|---|---|---|
| 2011/0284078 A1 | 11/2011 | Basol |
| 2012/0067392 A1 | 3/2012 | Gloeckler |
| 2012/0192923 A1 | 8/2012 | Korevaar et al. |

OTHER PUBLICATIONS

Kraft et al., "Characterization of tellurium layers for back contact formation on close to technology treated CdTe surfaces", AIP, Journal of Applied Physics, 2003, vol. 94, No. 5, 11 Pages.

Wang et al., "Leaching of Cadmium Tellurium and Copper from Cadmium Telluride Photovoltaic Modules", Brookhaven National Laboratory, Feb. 3, 2004, pp. 1-35.

Fthenakis et al., "Kinetics Study on Separation of Cadmium from Tellurium in Acidic Solution Media using Ion-Exchange Resins", Journal of Hazardous Materials, Feb. 26, 2005, pp. 1-9.

T. Potlog., "Develpopment of new Techniques of CdS/CdTe Solar Cell Enhancement", International Semiconductor Conference, Sep. 27-29, 2006, vol. 1, pp. 171-174.

Potlog et al., "Influence of annealing in different chlorides on the photovoltaic parameters of CdS/CdTe solar cells", Solar Energy Materials & Solar Cells, 2008, vol. 80, pp. 327-334.

Denysyuk et al., "Chemical treatment of monocrystalline cadmium telluride and Cd1-xMnxTe solid solutions by H2O2—HI-citric acid etchant compositions", Semiconductor Physics, Quantum Electronics & Optoelectronics, 2009, V. 12, N 2, pp. 125-128.

Tomashik et al., "Etching Behavior of CdTe in Aqueous H2O2—HI—C6H8O7 Solutions", Inorganic Materials, 2010, vol. 46, No. 8, pp. 812-817.

Ivanits'ka et al., "Chemical Polishing of CdTe and CdZnTe in Iodine-Methanol Etching Solutions", Journal of Electronic Materials, May 6, 2011, 7 Pages.

International Search Report and Written Opinion, Application No. PCT/US2013/57687 dated Feb. 6, 2014.

Wu et al. "Phase control of CuxTe film and its effects on CdS/CdTe solar cell," Thin Solid Films, vol. 515 pp. 5798-5803, Elsevier, Apr. 2007.

Extended European Search Report, Application No. EP13181235.6, dated Aug. 24, 2015.

\* cited by examiner

PHOTOVOLTAIC DEVICES

BACKGROUND

The invention generally relates to photovoltaic devices including a semiconductor layer. More particularly, the invention relates to thin-film photovoltaic devices including a semiconductor layer.

Thin film photovoltaic devices typically include a plurality of semiconductor layers disposed on a transparent substrate, wherein a first semiconductor layer serves as a window layer and a second semiconductor layer serves as an absorber layer. The window layer allows the penetration of solar radiation to the absorber layer, where the optical energy is converted to usable electrical energy. In certain configurations, thin film photovoltaic devices may further include an additional semiconductor layer interposed between the window layer and the absorber layer that may function as an intrinsic layer. Cadmium telluride/cadmium sulfide (CdTe/CdS) heterojunction-based photovoltaic devices are one such example of thin film solar cells, where a cadmium telluride (CdTe)-based semiconductor layer may function as an intrinsic layer or an absorber layer.

However, CdTe-based photovoltaic devices typically demonstrate relatively low power conversion efficiencies, which may be attributed to a relatively low open circuit voltage ($V_{oc}$) in relation to the band gap of the material which is due, in part, to the low effective carrier concentration and short minority carrier lifetime in CdTe. Effective carrier concentration of CdTe may be improved by doping with p-type dopants.

Further issues with improving the device efficiency of CdTe solar cells include the high work function of CdTe and high back-contact resistance at the interface between CdTe and metal-based back contact layer. The back-contact resistance may be improved by increasing the carrier concentration at the back interface. For example, for a p-type CdTe material, increasing the carrier concentration amounts to increasing the p-type carriers in the CdTe material to form an "ohmic contact layer" on the backside of the CdTe layer, which is in contact with the back contact layer.

Typical methods employed to form the ohmic layers or for doping the absorber layer include etching of the CdTe layers and incorporation of copper into back-end of line processing of the absorber layer. However, it may be difficult to control the amount of copper incorporated in the bulk and in the back interface, using a typical CdTe processing method. Further, photovoltaic devices manufactured using the typical methods may include a high copper content at the back-interface, which may adversely affect the long-term stability. Furthermore, etching of the CdTe layer using conventional etching agents may lead to removal of CdTe material from the surface, and selective etching of grain boundaries, resulting in increased defects.

Thus, there is a need for improved methods of processing semiconductor layers. Further, there is a need for improved photovoltaic device configurations including the semiconductor layers.

BRIEF DESCRIPTION OF THE INVENTION

Embodiments of the present invention are provided to meet these and other needs. One embodiment is a photovoltaic device. The photovoltaic includes a window layer and a semiconductor layer including a semiconductor material disposed on window layer. The semiconductor layer includes a first region and a second region, the first region disposed proximate to the window layer, and the second region including a chalcogen-rich region, wherein the first region and the second region include a dopant, and an average atomic concentration of the dopant in the second region is greater than an average atomic concentration of the dopant in the first region.

One embodiment is a photovoltaic device. The photovoltaic device, includes a window layer and a semiconductor layer disposed on window layer, wherein the semiconductor layer includes a first region and a second region, the first region disposed proximate to the window layer. The first region includes copper, the second region includes a tellurium-rich region and copper, and an average atomic concentration of copper in the second region is greater than an average atomic concentration of the copper in the first region.

One embodiment is a photovoltaic device. The photovoltaic device includes a window layer and a semiconductor layer disposed on the window layer, wherein upon exposure to 1-sun illumination at open circuit at a temperature of about 65° C. for 56 days, an efficiency of the photovoltaic device decreases by less than about 5 percent relative to an initial value, and a normalized series resistance increases by less than about 1.0 ohm-cm$^2$.

DRAWINGS

These and other features, aspects, and advantages of the present invention will become better understood when the following detailed description is read with reference to the accompanying drawings, wherein.

DETAILED DESCRIPTION

Figure 1:
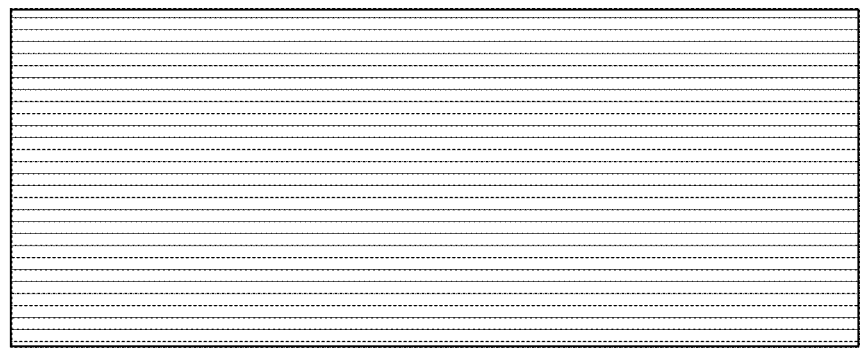
FIG. 1 is a side cross-section view of a semiconductor layer, according to some embodiments of the invention.

Some of the embodiments of the invention include photovoltaic devices including a semiconductor layer. More particularly, the invention relates to thin-film photovoltaic devices including a semiconductor layer.

As noted earlier, the conventional methods of making photovoltaic devices typically include etching and introduction of copper at the back-end line processing. However, it may be difficult to control the amount of copper incorporated in the bulk and in the back interface, using a typical CdTe processing method. Further, photovoltaic devices manufactured using the typical methods may include a high copper content at the back-interface, which may adversely affect the long-term stability. Furthermore, etching may lead to grain boundary modification and electrical shunting. Embodiments of the invention described herein address the noted shortcomings of the state of the art. Embodiments of the present invention advantageously provide for efficient and stable photovoltaic devices, and methods of making these.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The terms "transparent region" and "transparent layer" as used herein, refer to a region or a layer that allows an average transmission of at least 70% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated.

The terms "contacting" or "contacted" as used herein means that at least a portion of the semiconductor layer is exposed to, such as, in direct physical contact with a suitable contacting material, such as, for example, a passivating agent, a chemical agent, a dopant source, a contacting composition, a metal salt, or combinations thereof. In some embodiments, a surface of the semiconductor layer may be contacted with the suitable contacting material, for example using a surface treatment technique. In some other embodiments, a substantial portion of the semiconductor layer may be contacting with a suitable contacting material, for example, using an immersion treatment.

In the specification, drawings, and in the claims, the embodiments related to the methods are not limited by a particular sequence of steps, unless the context clearly indicates otherwise. Thus, in some embodiments, two or more of the steps of a method may be performed simultaneously. Alternatively, in some other embodiments, two or more of the steps of a method may be performed sequentially. Further, in the following specification, drawings, and in the claims, the embodiments related to the methods are not limited to the order of appearance of the steps in the claims, drawings, or in the specification. Thus, by way of example, in embodiments including steps (a), (b), and (c), the step (c) may be performed simultaneously with, prior to, or after the step (b). Further, in some embodiments, step (a) may be performed after step (b) or after step (c). In some other embodiments, all the three steps (a), (b), and (c) may be performed simultaneously.

As discussed in detail below, some embodiments of the invention are directed to methods for treating a semiconductor layer including a chalcogenide semiconductor material. The term "semiconductor layer" as used herein refers to a layer of semiconductor material that may be further disposed on one or more other layers. In some embodiments, the semiconductor layer is a component of a photovoltaic device. In some embodiments, the semiconductor layer includes an absorber layer. The term "absorber layer" as used herein refers to a semiconducting layer wherein the solar radiation is absorbed.

The term "chalcogenide" as used herein refers to a compound of at least one chalcogen and at least one electropositive element. The term "chalcogen" refers to tellurium, selenium, or sulfur. Suitable chalcogenide materials include cadmium telluride, magnesium telluride, mercury telluride, lead telluride, zinc telluride, cadmium selenide, mercury selenide, lead selenide, zinc selenide, cadmium sulfide, mercury sulfide, zinc sulfide, lead sulfide, cadmium zinc telluride, cadmium sulfur telluride, cadmium manganese telluride, cadmium magnesium telluride, or combinations thereof. The above-mentioned semiconductor materials may be used alone or in combination. Further, these materials may be present in more than one layer, each layer having different type of semiconductor material or having combinations of the materials in separate layers. In certain embodiments, the semiconductor layer includes cadmium telluride (CdTe). In certain embodiments, the semiconductor layer includes p-type cadmium telluride (CdTe).

Figure 2:
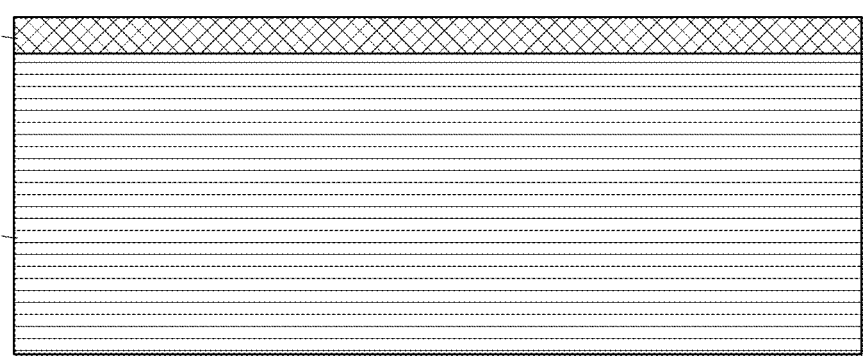
FIG. 2 is a side cross-section view of a semiconductor layer, according to some embodiments of the invention.
Figure 3:
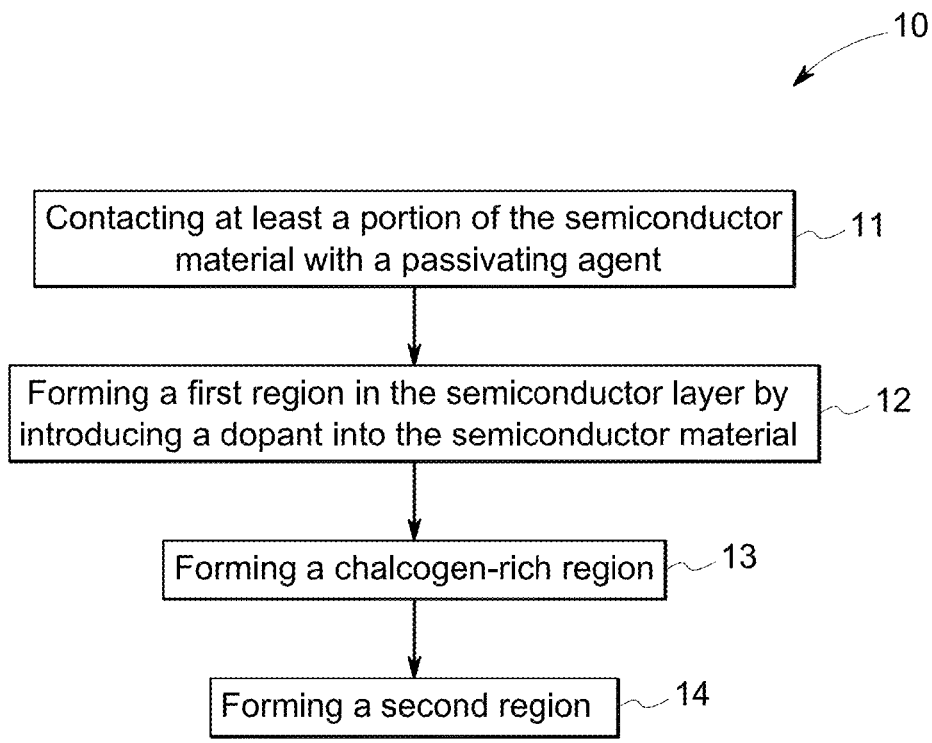
FIG. 3 is a flow-chart of a method for treating a semiconductor layer, according to some embodiments of the invention.

In accordance with one embodiment of the invention, a method for treating the semiconductor layer is presented. The method, in accordance with some embodiments of the invention, is further described with reference to FIGS. 1-3. FIG. 1 illustrates a side cross-sectional view of an untreated semiconductor layer 110 including a semiconductor material, as described hereinabove. FIG. 2 illustrates a side cross-sectional view of a treated semiconductor layer 110, in accordance with some embodiments of the invention. FIG. 3 illustrates a flow-chart of an exemplary embodiment for a method 10 of treating a semiconductor layer 110. It should be noted, in some embodiments, two or more of the steps in FIG. 3 may be performed simultaneously. Further, in some embodiments, two or more of the steps in FIG. 3, may be performed sequentially, and the method may not be limited by the order of appearance of steps.

In some embodiments, the method includes, at step 11, contacting at least a portion of the semiconductor material with a passivating agent. The term "passivating agent" as used herein refers to an agent capable of altering the physical or compositional characteristics of the semiconductor layer resulting in improved device performance. In some embodiments, the passivating agent may allow for removing defect states along the grain boundaries. In some embodiments, for example, the passivating agent may allow for diffusion between the CdS and CdTe layers in CdS/CdTe-based photovoltaic devices, thus enabling an improved interface.

In some embodiments, the passivating agent includes cadmium chloride ($CdCl_2$). In some embodiments, the method may include contacting at least a portion of the semiconductor material with cadmium chloride or a cadmium chloride source. In some embodiments, a portion of the semiconductor material may be treated with a solution of $CdCl_2$. In some embodiments, a portion of the semiconductor material may be treated with $CdCl_2$ vapor.

In some embodiments, the step of contacting at least a portion of the semiconductor material with a passivating agent further includes a heat treatment. In some embodiments, the heat treatment step may be performed subsequent to the step of contacting at least a portion of the semiconductor material with the passivating agent. In some embodiments, the heat treatment step may be performed simultaneously with the step of contacting at least a portion of the semiconductor material with the passivating agent.

In some embodiments, the heat treatment step is performed at a temperature within a range from about 300° C. to about 500° C. In some embodiments, the heat treatment step is performed at a temperature within a range from about 350° C. to about 450° C. In some embodiments, the heat treatment step is performed for a time duration within a range from about 1 minute to about 60 minutes. In some embodiments, the heat treatment step is performed for a time duration within a range from about 10 minutes to about 45 minutes. In some embodiments, the heat treatment step is performed in an inert environment. In some other embodiments, the heat treatment step is performed in an environment including an oxidizing environment. Non-limiting examples of oxidizing environments include air or oxygen.

In some embodiments, the method may further include contacting at least a portion of the semiconductor material with a cleaning agent, after the step of treating the semiconductor material with the passivating agent to remove any impurities, such as, for example, cadmium oxide from the surface. Suitable non-limiting examples of a cleaning agent include an aqueous solution of ethylene di-amine (EDA), ammonium hydroxide ($NH_4OH$), or combinations thereof.

With continued reference to FIGS. 2 and 3, in some embodiments, the method further includes, at step 12, forming a first region 112 in the semiconductor layer 110 by introducing a dopant into the semiconductor material. The term "dopant' as used herein refers to a species added to the semiconductor material to alter one or more properties, such as, for example, electrical properties. In some embodiments, the dopant in the first region 112 includes a p-type dopant. In some embodiments, the dopant in the first region 112 includes copper, silver, gold, or combinations thereof. In certain embodiments, the dopant in the first region includes copper. The term "copper" as used herein refers to elemental copper, copper ions, or combinations thereof. Thus, in certain embodiments, the first region 112 in the semiconductor layer 110 may include elemental copper, copper ions, or combinations thereof as dopants.

In some embodiments, an average atomic concentration of the dopant in the first region 112 is in a range from about $1 \times 10^{15}$ atoms/cm$^3$ to about $1 \times 10^{18}$ atoms/cm$^3$. In some embodiments, an average atomic concentration of the dopant in the first region 112 is in a range from about $1 \times 10^{16}$ atoms/cm$^3$ to about $5 \times 10^{17}$ atoms/cm$^3$. The term "atomic concentration" as used herein refers to the number of atoms per unit volume.

In some embodiments, the method includes, at step 12, introducing the dopant into the semiconductor material using a suitable deposition technique. Non-limiting examples of suitable deposition techniques may include physical vapor deposition, chemical vapor deposition, electrochemical deposition, chemical bath deposition, atomic layer deposition, closed space sublimation, or combinations thereof.

In some embodiments, the method includes, at step 12, contacting at least a portion of the semiconductor material with a dopant source. The portion of the semiconductor material contacted with the dopant source may depend, in part, on the physical form of the dopant source during the contacting step. In some embodiments, the dopant source is in the form of a solid, a solution, a suspension, a paste, vapor, or combinations thereof. Thus, by way of example, in some embodiments, the dopant source may be in the form of a paste, and the method may include depositing a paste of the dopant source on a surface of the semiconductor layer 110. In some other embodiments, for example, the dopant source may be in the form a vapor, and the method may include depositing the dopant source using a suitable vapor deposition technique. In some other embodiments, for example, the dopant source may be in the form a solution, and the method may include soaking at least a portion of the semiconductor layer 110 in the solution. In some such embodiments, the method may further include subjecting the semiconductor layer 110 to a heat treatment step to introduce the dopants into the semiconductor material.

In some embodiments, the dopant source includes a metal salt, and the step of introducing a dopant into the semiconductor material includes contacting at least a portion of the semiconductor material with a metal salt. The term "metal salt" as used herein refers to a compound including at least one metal cation and at least one anion. In some embodiments, the metal salt includes copper, gold, silver, or combinations thereof. In some embodiments, the metal salt further includes an anion. Non-limiting examples of a suitable anion include nitrate, acetate, chloride, iodide, or combinations thereof. In certain embodiments, the metal salt includes a chloride anion.

In certain embodiments, for example, the dopant source may be in the form a metal salt solution, and the method may include, at step 12, soaking at least a portion of the semiconductor material in the metal salt solution. In some embodiments, the semiconductor material may be substantially immersed in the metal salt solution. In some embodiments, the metal salt solution includes at least one solvent and at least one metal salt. In some embodiments, the at least one solvent includes water. In some embodiments, small amounts of water-soluble solvents may be added to provide wetting. Suitable non-limiting examples of such solvents include methanol, ethanol, iso-propanol, acetone, tetrahydrofuran, diglyme, or combinations thereof. In certain embodiments, the metals salt solution may be an aqueous-based metal salt solution.

In some embodiments, the method includes, at step 12, contacting at least a portion of the semiconductor material with a metal salt solution at a concentration, at a temperature, and for a time duration sufficient to effect cation exchange between the metal cations and the semiconductor material. The term "cation exchange" as used in this context refers to exchange of a portion of metal cations with the cations present in the semiconductor material.

In some embodiments, the dopant is present in the metal salt solution at a concentration in a range from about 10 parts per billion to about 10 parts per million. In some embodiments, the dopant is present in the metal salt solution at a concentration in a range from about 100 parts per billion to about 1000 parts per billion. In some embodiments, the dopant is present in the metal salt solution at a concentration in a range from about 150 parts per billion to about 500 parts per billion.

In some embodiments, the method includes, at step 12, contacting at least a portion of the semiconductor material with the metal salt solution at a temperature in a range from about 25 degrees Celsius to about 100 degrees Celsius. In some embodiments, the method includes, at step 12, contacting at least a portion of the semiconductor material with the metal salt solution at a temperature in a range from about 60 degrees Celsius to about 75 degrees Celsius. In some embodiments, the method includes, at step 12, contacting at least a portion of the semiconductor material with the metal salt solution for a time duration in a range from about 1 minute to about 30 minutes. In some embodiments, the method includes, at step 12, contacting at least a portion of the semiconductor material with the metal salt solution for a time duration in a range from about 2 minutes to about 10 minutes.

Referring again to FIG. 3, in some embodiments, the method includes, at step 13, forming a chalcogen-rich region. The term "chalcogen-rich region" as used herein refers to a region having an average atomic concentration of chalcogen greater than an average atomic concentration of the chalcogen in the bulk region (such as, first region 112) of the semiconductor layer 110. In some embodiments, the semiconductor material includes tellurium, and the method includes, at step 13, forming a tellurium-rich region in the semiconductor layer 110. The term "tellurium-rich region" as used herein refers to a region having an average atomic concentration of tellurium greater than a bulk region of the semiconductor layer 110. In some embodiments, a ratio of the average atomic concentration of tellurium in the tellurium-rich region to the average atomic concentration of tellurium in the bulk region of the semiconductor layer 110 is greater than about 1.2. In some embodiments, a ratio of the average atomic concentration of tellurium in the tellurium-rich region to the average atomic concentration of tellurium in the bulk region of the semiconductor layer 110 is greater than about 2.

In some embodiments, the tellurium-rich region may be further characterized by an average atomic ratio of tellurium to cadmium. In some embodiments, the tellurium-rich region has an average atomic ratio of tellurium to cadmium in a range greater than about 2. In some embodiments, the tellurium-rich region has an average atomic ratio of tellurium to cadmium in a range greater than about 10. In some embodiments, the tellurium-rich region has an average atomic ratio of tellurium to cadmium in a range greater than about 40. The term "atomic ratio" as used herein refers to a ratio of average atomic concentrations.

The tellurium in the tellurium-rich region may be in the form of elemental tellurium Te(0), telluride ($Te^{2-}$), or combinations thereof. In some embodiments, tellurium in the tellurium-rich region is in the form of elemental tellurium and also in the form of a telluride. In some embodiments, at least about 50 atomic percent tellurium in the tellurium-rich region is substantially in the form of elemental tellurium. In some embodiments, at least about 90 atomic percent tellurium in the tellurium-rich region is substantially in the form of elemental tellurium. In some embodiments, the tellurium-rich region has an average atomic ratio of elemental tellurium (Te(0)) to cadmium in a range greater than about 1. In some embodiments, the tellurium-rich region has an average atomic ratio of elemental tellurium (Te(0)) to cadmium in a range greater than about 10. In some embodiments, the tellurium-rich region has an average atomic ratio of elemental tellurium (Te(0)) to cadmium in a range greater than about 20. The atomic concentration of tellurium and the atomic ratio of tellurium to cadmium may be determined any suitable technique, such as, for example, x-ray photoelectron spectroscopy (XPS).

The chalcogen-rich region may be further characterized by the thickness. In some embodiments, the chalcogen-rich region has a thickness in a range greater than about 10 nanometers. In some embodiments, the chalcogen-rich region has a thickness in a range from about 10 nanometers to about 1000 nanometers. In some embodiments, the chalcogen-rich region has a thickness in a range from about 50 nanometers to about 500 nanometers. In some embodiments, the methods of the present invention may advantageously provide for a deeper chalcogen-rich region when compared to chalcogen-rich region formed using conventional etching chemical agents.

The chalcogen-rich region may be formed using a suitable additive or subtracting technique. In some embodiments, the method includes forming a chalcogen-rich region, at step 13, by depositing a region including the chalcogen on the semiconductor layer 110. Suitable non-limiting examples of additive deposition techniques may include physical vapor deposition, chemical vapor deposition, electrochemical deposition, chemical bath deposition, atomic layer deposition, closed space sublimation, or combinations thereof. In certain embodiments, the method includes forming a tellurium-rich region, at step 13, by depositing a tellurium-rich region on the semiconductor layer 110 using one or more of the aforementioned techniques.

In some other embodiments, the method includes forming a chalcogen-rich region, at step 13, by contacting at least a portion of the semiconductor material with a chemical agent. Suitable non-limiting examples of a chemical agent include, an oxidant, an acid, a metal halide or combinations thereof. In some embodiments, the chemical agent includes sulfuric acid, hydrochloric acid or combinations thereof. In certain embodiments, the chemical agent includes 1% (by volume) sulfuric acid. Suitable non-limiting examples of a metal halide include manganese chloride, zinc chloride, ammonium chloride, or combinations thereof. In certain embodiments, the chemical agent includes manganese chloride.

In some embodiments, the chemical agent includes iodine. As described in detail later, in some embodiments, iodine may be used as a chemical agent as a solid or in the form of a solution. In some embodiments, the iodine may be present in the chemical agent in elemental form. In some other embodiments, the iodine may be present in the chemical agent as an iodide. In such embodiments, the chemical agent may further include a suitable oxidizing agent capable of oxidizing the chemical agent to generate iodine under the reaction conditions. In some embodiments, the chemical agent may further include a solubilizing agent capable of increasing the solubility of iodine in a solution. In some embodiments, the solubilizing agent may include a halide. In certain embodiments, the solubilizing agent may include an iodide. In certain embodiments, the chemical agent includes a combination of iodine and iodide. Examples of suitable iodides include sodium iodide, potassium iodide, lithium iodide, or combinations thereof.

The portion of the semiconductor material contacted with the chemical agent may depend, in part, on the physical form of the chemical agent during the contacting step. In some embodiments, the chemical agent is in the form of a solid, a solution, a suspension, a paste, vapor, or combinations thereof. Thus, by way of example, in some embodiments, the chemical agent may be in the form of a paste, and the method may include depositing a paste of the chemical agent on a surface of the semiconductor layer 110. In some other embodiments, for example, the chemical agent may be in the form a solution, and the method may include soaking at least a portion of the semiconductor material in the chemical agent solution. In some embodiments, the chemical agent solution may include a solvent in addition to the chemical agent. In some embodiments, the chemical agent solution may be aqueous-based.

In some embodiments, the method includes, at step 13, contacting at least a portion of the semiconductor material with a tellurium-enriching chemical agent to form a tellurium-rich region in the semiconductor layer 110. The term "tellurium-enriching chemical agent" as used herein refers to a chemical agent that when contacted with the semiconductor layer 110 under suitable contacting conditions results in formation of a tellurium-rich region, while keep the grain boundary morphology substantially intact relative to the grains of the semiconductor layer. The term "grain boundary morphology" as used herein refers to one or more of grain boundary size, grain boundary shape, and grain boundary composition.

In some embodiments, the tellurium-enriching agent further does not lead to a substantial dissolution of a surface of the semiconductor layer. The term "substantial dissolution" as used herein refers to removal of greater than about 10 nanometers of the semiconductor surface layer. In contrast, an "etching chemical agent" preferentially etches grain boundaries of the semiconductor layer relative to the grains; and further leads to substantial dissolution of a surface of the semiconductor layer.

The term "contacting conditions" as used in this context refers to one or more of chemical agent concentration, reaction temperature, and time duration of contacting the chemical agent with the semiconductor layer. In some embodiments, the chemical agent is present in the chemical agent solution at a concentration in a range from about 0.01 grams per liter to about 1 gram per liter. In certain embodiments, the chemical agent is present in the chemical agent solution at a concentration in a range from about 0.05 grams per liter to about 0.5 grams per liter.

In some embodiments, the method includes contacting at least a portion of the semiconductor material with the chemical agent at a temperature in a range from about 45 degrees Celsius to about 180 degrees Celsius. In certain embodiments, the method includes contacting at least a portion of the semiconductor material with the chemical agent at a temperature in a range from about 50 degrees Celsius to about 70 degrees Celsius. In some embodiments, the method includes contacting at least a portion of the semiconductor material with the chemical agent for a time duration in a range from about 30 seconds to about 10 minutes. In some embodiments, the method includes contacting at least a portion of the semiconductor material with the chemical agent for a time duration in a range from about 1 minute to about 5 minutes.

With continued reference to FIGS. 2 and 3, in some embodiments, the method includes, at step 14, forming a second region 114 in the semiconductor layer 110, wherein the second region 114 includes a dopant. In some embodiments, the method includes, at step 14, introducing a dopant into the semiconductor material to form the second region 114. In some embodiments, the dopant in the second region 114 includes copper, silver, gold, or combinations thereof. In certain embodiments, the dopant in the second region 114 includes copper. In certain embodiments, the second region 114 in the semiconductor layer 110 includes elemental copper, copper ions, or combinations thereof as dopants.

In some embodiments, the method includes, at step 14, forming a second region 114 using a suitable deposition technique. Non-limiting examples of suitable deposition techniques may include physical vapor deposition, chemical vapor deposition, electrochemical deposition, chemical bath deposition, atomic layer deposition, closed space sublimation, or combinations thereof.

In some embodiments, the method includes, at step 14, contacting at least a portion of the semiconductor material with a contacting composition including the dopant. The portion of the semiconductor material contacted with the contacting composition may depend, in part, on the physical form of the contacting composition during the contacting step. In some embodiments, the contacting composition is in the form of a solid, a solution, a suspension, a paste, vapor, or combinations thereof. Thus, by way of example, in some embodiments, the contacting composition may be in the form of a paste, and the method may include depositing a paste of the contacting composition on a surface of the semiconductor layer 110. In some embodiments, the contacting composition may be in the form a vapor, and the method may include depositing the contacting composition using a suitable vapor deposition technique. In some other embodiments, for example, the contacting composition may be in the form a solution, and the method may include soaking at least a portion of the semiconductor layer 110 in the solution. In some such embodiments, the method may further include subjecting the semiconductor layer 110 to a heat treatment step to introduce the dopant into the semiconductor material.

In some embodiments, the contacting composition includes a metal salt, and the step of forming a second region 114 includes contacting at least a portion of the semiconductor material with a metal salt. In some embodiments, the metal salt includes copper, gold, silver, or combinations thereof. In some embodiments, the metal salt further includes an anion. Suitable non-limiting examples of an anion include nitrate, acetate, iodide, chloride, or combinations thereof. In certain embodiments, the metal salt includes a chloride anion.

In certain embodiments, for example, the dopant may be in the form a metal salt solution, and the method may include, at step 14, soaking at least a portion of the semiconductor material in the metal salt solution. In some embodiments, the semiconductor material may be substantially immersed in the metal salt solution. In some embodiments, the metal salt solution includes at least one solvent and at least one metal salt. In some embodiments, the at least one solvent includes water. In some embodiments, small amounts of water-soluble solvents may be added to provide wetting. Suitable examples of such solvents include methanol, ethanol, iso-propanol, acetone, tetrahydrofuran, diglyme, or combinations thereof. In certain embodiments, the metal salt solution may be an aqueous-based metal salt solution.

In some embodiments, the dopant is present in the metal salt solution at a concentration less than about 10 parts per million. In some embodiments, the dopant is present in the metal salt solution at a concentration in a range from about 10 parts per billion to about 1000 parts per billion. In some embodiments, the dopant is present in the metal salt solution at a concentration in a range from about 100 parts per billion to about 500 parts per billion.

In some embodiments, the method includes, at step 14, contacting at least a portion of the semiconductor material with the metal salt solution at a temperature in a range from about 25 degrees Celsius to about 100 degrees Celsius. In some embodiments, the method includes, at step 14, contacting at least a portion of the semiconductor material at a temperature in a range from about 60 degrees Celsius to about 75 degrees Celsius.

In some embodiments, the method includes, at step 14, contacting at least a portion of the semiconductor material with the metal salt solution for a time duration in a range from about 1 minute to about 30 minutes. In some embodiments, the method includes, at step 14, contacting at least a portion of the semiconductor material with the metal salt solution for a time duration in a range from about 2 minutes to about 10 minutes.

In certain embodiments, the method includes, at step 14, doping the chalcogen-rich region with the dopant to form the second region 114. In some embodiments, the step of forming a second region 114 may further include forming a chalcogenide of the dopant species. In some embodiments, the step of forming a second region 114 may further include forming a telluride of the dopant species. In certain embodiments, the second region 114 may include copper telluride. In some embodiments, the chalcogen-rich region includes the second region 114. In some other embodiments, the second region 114 includes the chalcogen-rich region. In some other embodiments, the chalcogen-rich region and the second region 114 are substantially overlapping.

In some embodiments, an average atomic concentration of the dopant in the second region 114 is greater than about $5 \times 10^{18}$ atoms/cm$^3$. In some embodiments, an average atomic concentration of the dopant in the second region 114 is in a range greater than about $1 \times 10^{19}$ atoms/cm$^3$. In some embodiments, an average atomic concentration of the dopant in the second region 114 is in a range from about $5 \times 10^{18}$ atoms/cm$^3$ to about $1 \times 10^{20}$ atoms/cm$^3$.

As noted earlier, the method includes treating a semiconductor layer 110 to form a first region 112 and a second region 114, wherein an average atomic concentration of the dopant in the second region 114 is greater than an average atomic concentration of the dopant in the first region 112. In some embodiments, a ratio of the average atomic concentration of the dopant in the second region 114 to the average atomic concentration of the dopant in the first region 112 is greater than about 5. In some embodiments, a ratio of the average atomic concentration of the dopant in the second region 114 to the average atomic concentration of the dopant in the first region 112 is greater than about 10. In some embodiments, a ratio of the average atomic concentration of the dopant in the second region 114 to the average atomic concentration of the dopant in the first region 112 is greater than about 50.

Without being bound by any theory, it is believed that doping of the semiconductor layer 110 with the dopant to the form the first region 112 may advantageously enable increased carrier concentration of the photo-active material. An increased carrier concentration may further advantageously result in increase in $V_{OC}$ that may furthermore result in increased photovoltaic device efficiency. Further, without being bound by any theory, it is believed that forming a second region 114 by doping the chalcogen-rich region may advantageously result in decreased resistivity of the semiconductor layer 110 surface and lower open circuit resistance ($R_{OC}$), which may furthermore result in increased photovoltaic device efficiency. Furthermore, embodiments of the present invention advantageously provide for stable photovoltaic devices by using different concentration profiles of the dopant in the first region 112 and the second region 114, which may lead to more stable photovoltaic devices.

As noted earlier, the method may include any sequence of steps. In some embodiments, two or more of the steps 11, 12, 13, and 14 are performed simultaneously. In some embodiments, two or more of the steps 11, 12, 13, and 14 are performed sequentially. Further, as noted earlier, the method is not limited by a particular sequence of steps. Thus, in some embodiments, the steps 11 and 12 may be performed simultaneously. In some alternate embodiments, the steps 11 and 12 may be performed sequentially. Further, the method may not be limited by the order of steps. In some embodiments, the step 11 may be performed before step 12, or alternatively, the step 12 may be performed before the step 11.

In some embodiments, at least a portion of the semiconductor material is contacted with the passivating agent and the dopant source sequentially. In some embodiments, the method may include the step of contacting at least a portion of the semiconductor material with the passivating agent followed by the step of contacting at least a portion of the semiconductor material with the dopant source. In some embodiments, the method may include the step of contacting at least a portion of the semiconductor material with the dopant source followed by the step of contacting at least a portion of the semiconductor material with the passivating agent. In certain embodiments, the method includes, at step 11, contacting (for example, by soaking or spraying) at least a portion of the semiconductor material with a cadmium chloride solution; and subsequently, at step 12, contacting (for example, by soaking or spraying) at least a portion of the semiconductor material with a copper salt solution. In certain embodiments, the method includes, at step 12, contacting (for example, by soaking or spraying) at least a portion of the semiconductor material with a copper salt solution, and then subsequently, at step 11, contacting (for example, by soaking or spraying) at least a portion of the semiconductor material with a cadmium chloride solution.

In alternate embodiments, at least a portion of the semiconductor material is contacted with the passivating agent and the dopant source concurrently. In some embodiments, the passivating agent and the dopant source may, for example, be present in the same solution, or paste. In certain embodiments, the method includes, at steps 11 and 12, contacting at least a portion of the semiconductor material with a solution including cadmium chloride and a copper salt. In certain embodiments, at least a portion of the semiconductor material may be soaked in a solution including the cadmium chloride and the copper salt, or, alternatively the cadmium chloride and the copper salt maybe concurrently sprayed onto the surface of the semiconductor layer 110.

In some embodiments, the steps 13 and 14 may be performed simultaneously. In some alternate embodiments, the steps 13 and 14 may be performed sequentially. Further, the method may not be limited by the order of steps. In some embodiments, the step 13 may be performed before step 14, or alternatively, the step 14 may be performed before the step 13.

In some embodiments, at least a portion of the semiconductor material is contacted with the chemical agent and the contacting composition sequentially. In some embodiments, the method may include the step of contacting at least a portion of the semiconductor material with the chemical agent followed by the step of contacting at least a portion of the semiconductor material with the contacting composition. In some embodiments, the method may include the step of contacting at least a portion of the semiconductor material with the contacting composition followed by the step of contacting at least a portion of the semiconductor material with the chemical agent. In certain embodiments, the method includes, at step 13, contacting (for example, by soaking or spraying) at least a portion of the semiconductor material with an iodine solution; and subsequently at step 14, contacting (for example, by soaking or spraying) at least a portion of the semiconductor material with a copper salt solution.

In alternate embodiments, at least a portion of the semiconductor material is contacted with the chemical agent and the contacting composition concurrently. In some embodiments, the chemical agent and the contacting composition may, for example, be present in the same solution, or paste. In certain embodiments, the method includes, simultaneously, at step 13 and 14, contacting at least a portion of the semiconductor material with a solution including iodine and a copper salt. In certain embodiments, at least a portion of the semiconductor layer 110 may be soaked in a solution including iodine and a copper salt.

Further, in some embodiments, the method may include performing the steps 12, 13, and 14 simultaneously. In some such embodiments, the method may include, simultaneously, at steps 12, 13 and 14, contacting at least a portion of the semiconductor material with a composition including the chemical agent and the dopant. In some such embodiments, the method may further include a heat treatment step to introduce at least a portion of the dopant into the semiconductor material to form the first region 112. In some such embodiment, the method may further include forming a second region 114 by forming a chalcogen region including the dopant, such that the concentration of dopant in the second region 114 is greater than the concentration of the dopant in the first region 112. In an exemplary embodiment, the method may include contacting at least a portion of the semiconductor material with a solution including iodine and a copper salt, followed by a heat treatment step.

In certain embodiments, steps 12 and 14 are performed sequentially. In some such embodiments, steps 11 and 12 may be performed simultaneously, or alternatively, in some other embodiments, steps 11 and 12 may be performed sequentially. Further, steps 13 and 14 may be performed simultaneously, in some embodiments, or alternatively, in some other embodiments, steps 13 and 14 may be performed sequentially. Without being bound by any theory, it is believed, that by performing the steps 12 and 14 separately, the amount of dopant introduced into the semiconductor layer, in the first region 112 and the second region 114 may be more effectively controlled, which may lead to more efficient and stable photovoltaic devices, in accordance with some embodiments of the invention.

In accordance with one embodiment of the invention, a method for treating the semiconductor layer 110 is presented. The method, in accordance with some embodiments of the invention, is further described with reference to FIG. 4. In some embodiments, the method 20 includes, at step 21, contacting at least a portion of the semiconductor material with a passivating agent. The method includes, at step 22, introducing a dopant into the semiconductor material. The method includes, at step 23, forming a chalcogen-rich region by contacting at least a portion of the semiconductor material with a chemical agent, wherein the chemical agent includes iodine.

Figure 4:
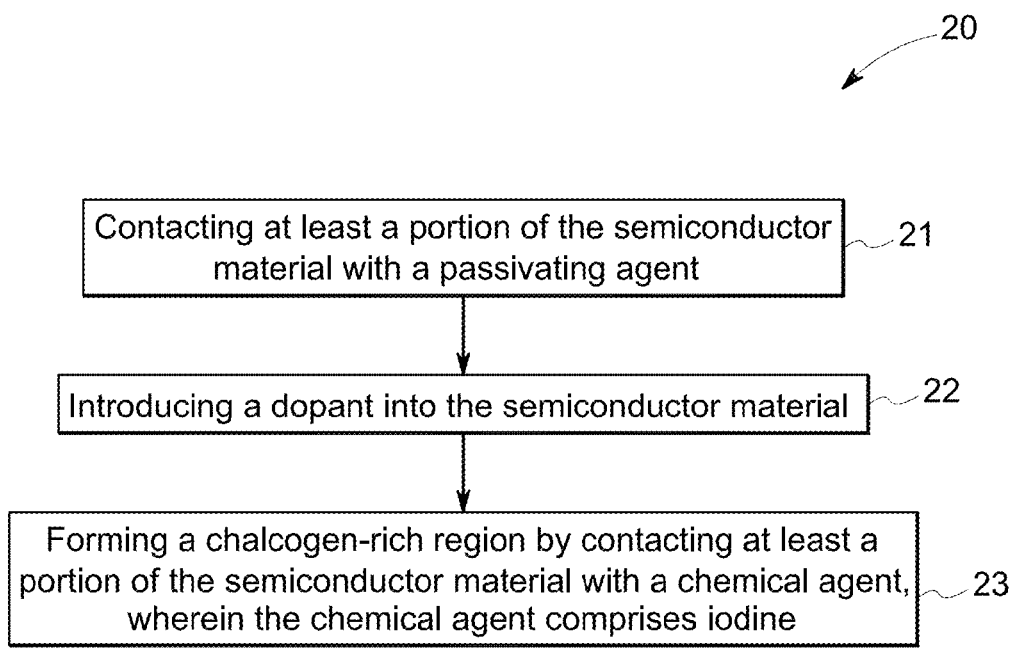
FIG. 4 is a flow-chart of a method for treating a semiconductor layer, according to some embodiments of the invention.

It should be noted, in some embodiments, two or more of the steps in FIG. 4 may be performed simultaneously. Further, in some embodiments, two or more of the steps in FIG. 4, may be performed sequentially, and the method may not be limited by the order of appearance of steps. In certain embodiments, the step 22 is performed before step 23. In certain embodiments, the steps 21 and 22 are performed simultaneously, or, alternatively, in some other embodiments, the steps 21 and 22 are performed sequentially.

The details of the method steps 21, 22, and 23 are described herein earlier with reference to FIG. 3. In some embodiments, the dopant includes copper, silver, gold, or combinations thereof. In certain embodiments, the dopant includes copper. In certain embodiments, the dopant includes elemental copper, copper ions, or combinations thereof.

In some embodiments, an average atomic concentration of the dopant in the semiconductor material is in a range from about $1\times10^{15}$ atoms/cm$^3$ to about $1\times10^{18}$ atoms/cm$^3$. In some embodiments, an average atomic concentration of the dopant in the semiconductor material is in a range from about $1\times10^{16}$ atoms/cm$^3$ to about $5\times10^{17}$ atoms/cm$^3$.

In some embodiments, the method includes, at step 23, forming a tellurium-rich region. In some embodiments, the tellurium-rich region has an average atomic ratio of tellurium to cadmium in a range greater than about 2. In some embodiments, the tellurium-rich region has an average atomic ratio of tellurium to cadmium in a range greater than about 10. In some embodiments, the tellurium-rich region has an average atomic ratio of tellurium to cadmium in a range greater than about 40.

In accordance with one embodiment of the invention, a method for treating the semiconductor layer is presented. The method 30, in accordance with some embodiments of the invention, is further described with reference to FIG. 5. In some embodiments, the method 30 includes, at step 31, forming a chalcogen-rich region by contacting at least a portion of the semiconductor material with a chemical agent, wherein the chemical agent includes iodine. The method includes, at step 32, introducing a dopant into the chalcogen-rich region.

Figure 5:
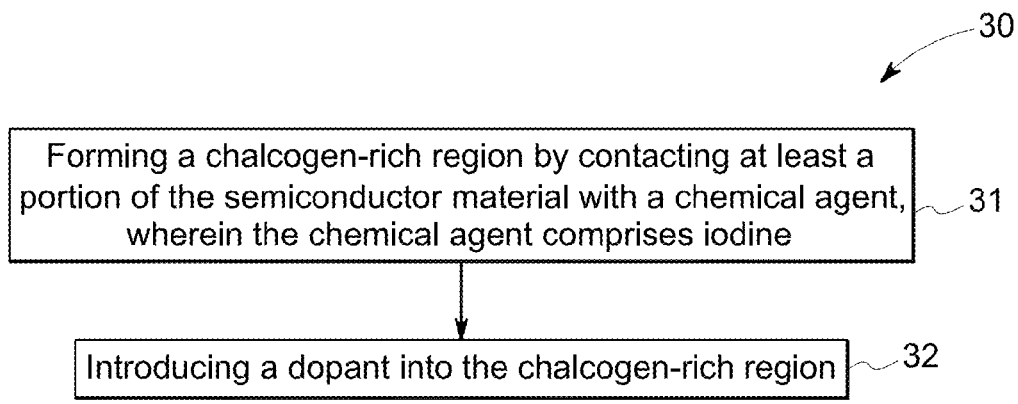
FIG. 5 is a flow-chart of a method for treating a semiconductor layer, according to some embodiments of the invention.

It should be noted, in some embodiments, the steps 31 and 32 in FIG. 5 may be performed simultaneously. In some alternate embodiments, the steps 31 and 32 steps in FIG. 5, may be performed sequentially, and the method may not be limited by the order of appearance of steps. In certain embodiments, the step 31 is performed before step 32.

The details of the method steps 31 and 32 are as described herein earlier with reference to FIG. 3. In some embodiments, the method includes, at step 31, forming a tellurium-rich region. In some embodiments, the tellurium-rich region has an average atomic ratio of tellurium to cadmium in a range greater than about 2. In some embodiments, the tellurium-rich region has an average atomic ratio of tellurium to cadmium in a range greater than about 10. In some embodiments, the tellurium-rich region has an average atomic ratio of tellurium to cadmium in a range greater than about 40.

In some embodiments, the dopant includes copper, silver, gold, or combinations thereof. In certain embodiments, the dopant includes copper. In certain embodiments, the dopant includes elemental copper, copper ions, or combinations thereof as dopants. In some embodiments, an average atomic concentration of the dopant in the chalcogen-rich region is greater than about $5 \times 10^{18}$ atoms/cm$^3$. In some embodiments, an average atomic concentration of the dopant in the chalcogen-rich is in a range greater than about $1 \times 10^{19}$ atoms/cm$^3$. In some embodiments, an average atomic concentration of the dopant in the chalcogen-rich region is in a range from about $5 \times 10^{18}$ atoms/cm$^3$ to about $1 \times 10^{20}$ atoms/cm$^3$.

In accordance with one embodiment of the invention, a method for treating the semiconductor layer 110 is presented. The method 40, in accordance with some embodiments of the invention, is further described with reference to FIG. 6. In some embodiments, the method includes, at step 41, contacting at least a portion of the semiconductor material with a chemical agent, wherein the chemical agent includes iodine. The method includes, at step 42, contacting at least a portion of the semiconductor material with copper.

Figure 6:
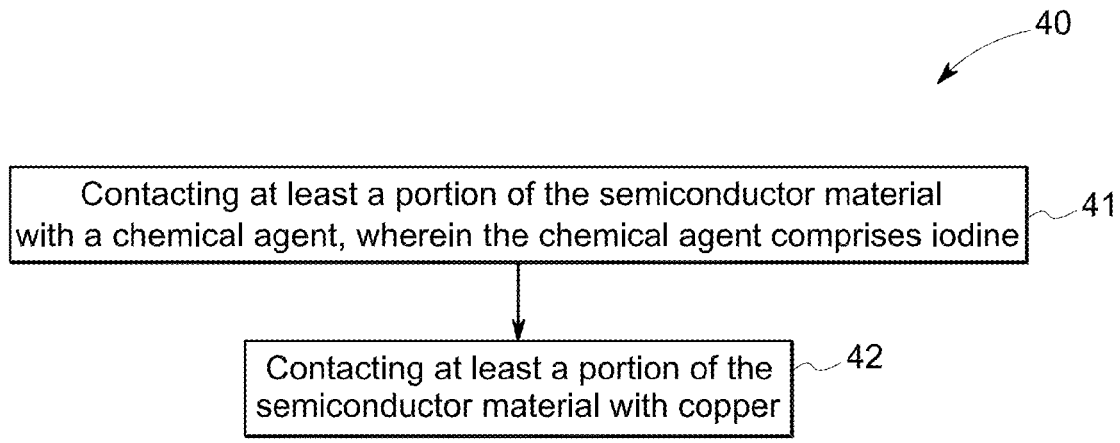
FIG. 6 is a flow-chart of a method for treating a semiconductor layer, according to some embodiments of the invention.

It should be noted, in some embodiments, the steps 41 and 42 in FIG. 6 may be performed simultaneously. Further, in some embodiments, the steps 41 and 42 in FIG. 6, may be performed sequentially, and the method may not be limited by the order of appearance of steps. In certain embodiments, the step 41 is performed before the step 42.

In accordance with one embodiment of the invention a method for treating the semiconductor layer is presented. The method 50, in accordance with some embodiments of the invention, is further described with reference to FIG. 7. In some embodiments, the method 50 includes, at step 51, contacting at least a portion of the semiconductor material with a chemical agent, wherein the chemical agent comprises a metal halide. The method includes, at step 52, contacting at least a portion of the semiconductor material with copper.

Figure 7:
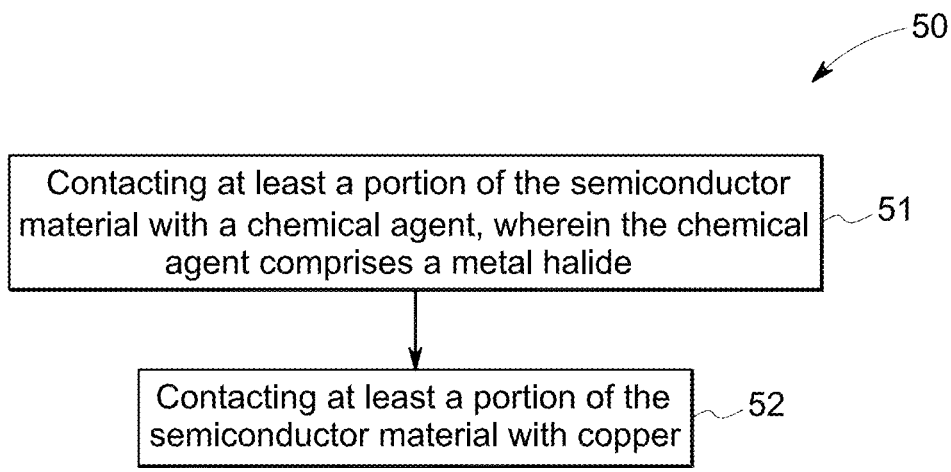
FIG. 7 is a flow-chart of a method for treating a semiconductor layer, according to some embodiments of the invention.

It should be noted, in some embodiments, the steps 51 and 52 in FIG. 7 may be performed simultaneously. Further, in some embodiments, the steps 51 and 52 in FIG. 6, may be performed sequentially, and the method may not be limited by the order of appearance of steps. In certain embodiments, the step 51 is performed before the step 52.

In accordance with one embodiment of the invention a method for treating the semiconductor layer is presented. In some embodiments, the method includes contacting at least a portion of the semiconductor material with a tellurium-enriching chemical agent to form a tellurium-rich region, wherein the tellurium-enriching chemical agent includes iodine. The tellurium-enriching chemical agent has been described earlier.

Figure 8:
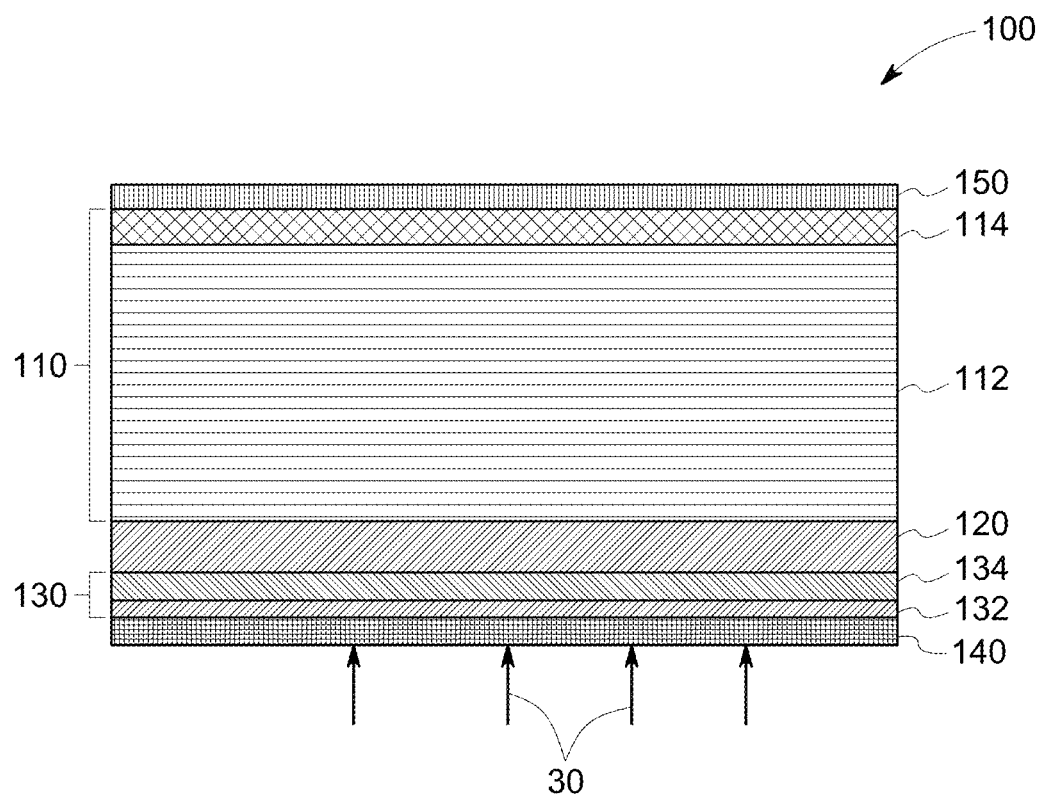
FIG. 8 is a side cross-section view of a photovoltaic device, according to some embodiments of the invention.
Figure 9:
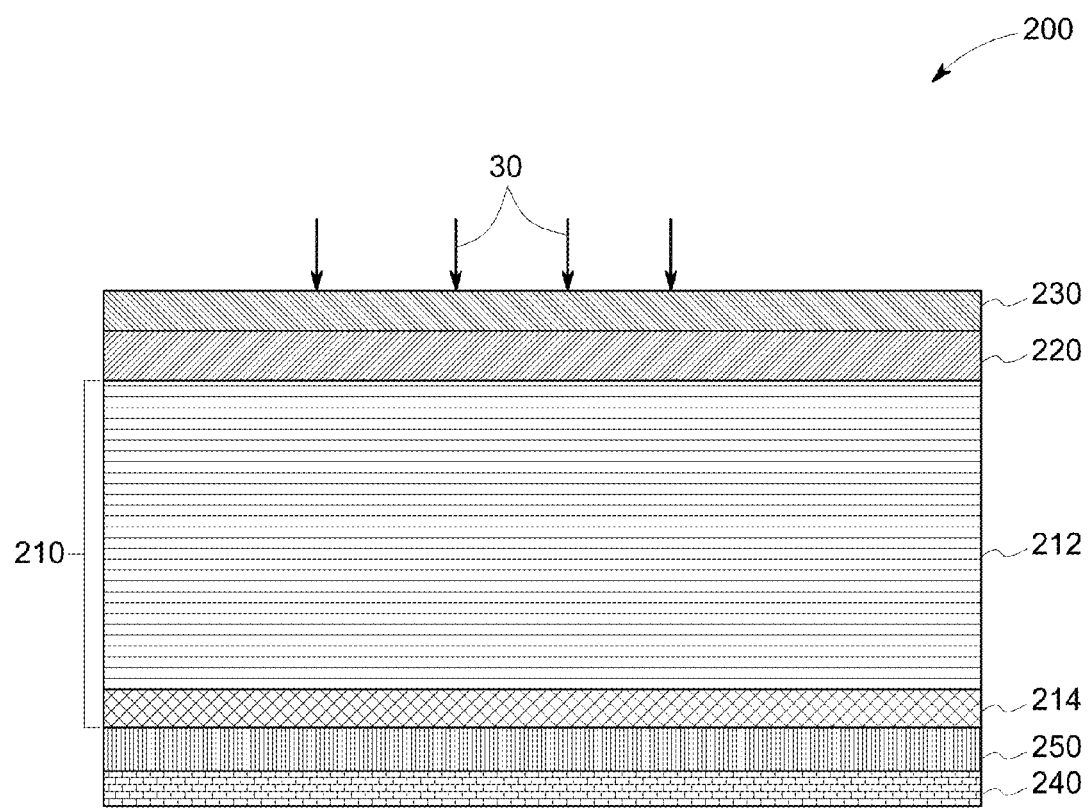
FIG. 9 is a side cross-section view of a photovoltaic device, according to some embodiments of the invention.

With the foregoing in mind, photovoltaic devices and methods of making photovoltaic devices, according to some embodiments of the invention, are further described herein. Referring now to FIGS. 8 and 9, a photovoltaic device 100/200 includes a window layer 120/220 and a semiconductor layer 110/210 disposed on window layer 120/220. The semiconductor layer 110/210 includes a first region 112/212 and a second region 114/214, the first region 112/212 disposed proximate to the window layer 120/220. The first region 112/212 and the second region 114/214 include a dopant, wherein an average atomic concentration of the dopant in the second region 114/214 is greater than an average atomic concentration of the dopant in the first region 112/212. The term "disposed on" as used herein means that depending on the configuration of the photovoltaic device, either the window layer 120/220 or the semiconductor layer 110/210 may be disposed on top of the other. Further, in some embodiments, one or more intervening layers may be disposed between the window layer 120/220 and the semiconductor layer 110/210. The term "proximate" as used herein means that the first region 112/212 is disposed closer to the window layer 120/220 when compared to the back contact layer 150/250.

The term "semiconductor layer" has been described in detail earlier. The term "window layer" as used herein refers to a semiconducting layer that is substantially transparent and forms a heterojunction with the semiconductor layer 110/210. In some embodiments, the window layer 120/220 includes an n-type semiconductor material. In such embodiments, the semiconductor layer 110/210 may be doped to be p-type and the window layer 120/220 and the semiconductor layer 110/210 may form an "n-p" heterojunction. Non-limiting exemplary materials for the window layer 120/220 include cadmium sulfide (CdS), indium (III) sulfide (In$_2$S$_3$), zinc sulfide (ZnS), zinc telluride (ZnTe), zinc selenide (ZnSe), cadmium selenide (CdSe), oxygenated cadmium sulfide (CdS:O), copper oxide (Cu$_2$O), zinc oxide hydrate (ZnO.H$_2$O), or combinations thereof. In a particular embodiment, the window layer 120/220 includes CdS, CdS:O, or combinations thereof.

In some embodiments, the dopant in the first region 112/212 includes a p-type dopant. In some embodiments, the dopant in the first region 112/212 includes copper, silver, gold, or combinations thereof. In certain embodiments, the dopant in the first region 112/212 includes copper. In certain embodiments, the dopant in the first region 112/212 includes elemental copper, copper ions, or combinations thereof.

In some embodiments, a concentration of the dopant in the first region 112/212 is substantially constant across the thickness of the first region 112/212. The term "substantially constant" as used herein means that a variance in the concentration of the dopant is less than about 5 percent across the thickness of the first region 112/212. In some other embodiments, the semiconductor layer 110/210 includes a variable concentration of the dopant across the thickness of the first region 112/212.

In some embodiments, an average atomic concentration of the dopant in the first region 112/212 is in a range from about $1 \times 10^{15}$ atoms/cm$^3$ to about $1 \times 10^{18}$ atoms/cm$^3$. In some embodiments, an average atomic concentration of the dopant in the first region 112/212 is in a range from about $1 \times 10^{16}$ atoms/cm$^3$ to about $5 \times 10^{17}$ atoms/cm$^3$.

The second region 114/214 further includes a chalcogen-rich region. In some embodiments, the second region 114/214 further includes a tellurium-rich region. The terms "chalcogen-rich region" and "tellurium-rich region" have been defined earlier. In some embodiments, the tellurium-rich region may be further characterized by an average atomic ratio of tellurium to cadmium. In some embodiments, the tellurium-rich region has an average atomic ratio of tellurium to cadmium in a range greater than about 2. In some embodiments, the tellurium-rich region has an average atomic ratio of tellurium to cadmium in a range greater than about 10. In some embodiments, the tellurium-rich region has an average atomic ratio of tellurium to cadmium in a range greater than about 40. The tellurium in the tellurium-rich region may be in the form of elemental tellurium Te(0), telluride (Te$^2$), or combinations thereof. In some embodiments, tellurium in the tellurium rich region is in the form of elemental tellurium and also in the form of a telluride.

The chalcogen-rich region may be further characterized by the thickness. In some embodiments, the chalcogen-rich region has a thickness in a range greater than about 10 nanometers. In some embodiments, the chalcogen-rich region has a thickness in a range from about 10 nanometers to about 1000 nanometers. In some embodiments, the chalcogen-rich region has a thickness in a range from about 50 nanometers to about 500 nanometers.

In some embodiments, the dopant in the second region 114/214 includes copper, silver, gold, or combinations thereof. In certain embodiments, the dopant in the second region 114/214 includes copper. In certain embodiments, the second region 114/214 in the semiconductor layer 110/210 includes elemental copper, copper ions, or combinations thereof as dopants. In certain embodiments, the second region 114/214 may include copper telluride.

In some embodiments, an average atomic concentration of the dopant in the second region 114/214 is greater than about $5\times10^{18}$ atoms/cm$^3$. In some embodiments, an average atomic concentration of the dopant in the second region 114/214 is in a range greater than about $1\times10^{19}$ atoms/cm$^3$. In some embodiments, an average atomic concentration of the dopant in the second region 114/214 is in a range from about $5\times10^{18}$ atoms/cm$^3$ to about $1\times10^{20}$ atoms/cm$^3$.

As noted earlier, an average atomic concentration of the dopant in the second region 114/214 is greater than an average atomic concentration of the dopant in the first region 112/212. In some embodiments, a ratio of the average atomic concentration of the dopant in the second region 114/214 to the average atomic concentration of the dopant in the first region 112/212 is greater than about 5. In some embodiments, a ratio of the average atomic concentration of the dopant in the second region 114/214 to the average atomic concentration of the dopant in the first region 112/212 is greater than about 10. In some embodiments, a ratio of the average atomic concentration of the dopant in the second region 114/214 to the average atomic concentration of the dopant in the first region 112/212 is greater than about 50.

In some embodiments, the semiconductor layer 110/210 further includes iodine, and a concentration of iodine in the semiconductor layer 110/210 varies across the thickness of the semiconductor layer 110/210. In some embodiments, as described in detail later, wherein the semiconductor layer 110/210 is interposed between a back contact layer and a window layer, the concentration of iodine in the semiconductor layer 110/210 may decrease in a direction away from the back contact layer and towards the window layer. In some embodiments, an average concentration of iodine in the semiconductor layer 110/210 is in a range from about $1\times10^{16}$ atoms/cm$^3$ to about $1\times10^{19}$ atoms/cm$^3$. In some embodiments, an average concentration of iodine in the semiconductor layer 110/210 is in a range from about $1\times10^{15}$ atoms/cm$^3$ to about $1\times10^{19}$ atoms/cm$^3$. In some embodiments, an average concentration of iodine in the semiconductor layer 110/210 is in a range from about $1\times10^{16}$ atoms/cm$^3$ to about $1\times10^{18}$ atoms/cm$^3$.

In some embodiments, the semiconductor layer 110/210 includes a plurality of grain boundaries and a morphology of the plurality of grain boundaries is substantially the same across the thickness of the semiconductor layer 110/210. The term "grain boundary morphology" as used herein refers to one or more of grain boundary size, grain boundary shape, and grain boundary composition. In some embodiments, the grain boundary morphology in the tellurium-rich region 114/214 and the bulk region 112/212 may be substantially same. In contrast, a semiconductor layer subjected to a treatment using a strong etching chemical agent" typically includes grain boundaries that are preferentially etched relative to the grains on the surface of the semiconductor layer, and may have variable grain morphology across the thickness of the semiconductor layer. As noted earlier, the photovoltaic devices according to some embodiments of the invention advantageously provide for a semiconductor layer with a tellurium-rich region that may function as an ohmic back contact, while keep the grain boundaries of the semiconductor layer intact.

Referring now to FIGS. 8 and 9, in accordance with some embodiments of the invention, photovoltaic device configurations and methods of making the photovoltaic devices are further described herein. With continued reference to FIG. 8, in some embodiments, the photovoltaic device 100 includes a "superstrate" configuration of layers. In such embodiments, the photovoltaic device 100 further includes a support 140 and a transparent layer 130 is disposed on the support 140, as indicated in FIG. 8. The window layer 120 is disposed on the transparent layer 130 and the semiconductor layer 110 is disposed on the window layer 120, as indicated in FIG. 8. In such embodiments, the solar radiation 30 enters from the support 140, and after passing through the transparent layer 130 and the window layer 120, enters the semiconductor layer 110, where the conversion of electromagnetic energy of incident light (for instance, sunlight) to electron-hole pairs (that is, to free electrical charge) occurs.

In some embodiments, the support 140 is transparent over the range of wavelengths for which transmission through the support 140 is desired. In one embodiment, the support 140 may be transparent to visible light having a wavelength in a range from about 400 nm to about 1000 nm. In some embodiments, the support 140 includes a material capable of withstanding heat treatment temperatures greater than about 600° C., such as, for example, silica or borosilicate glass. In some other embodiments, the support 140 includes a material that has a softening temperature lower than 600° C., such as, for example, soda-lime glass or a polyimide. In some embodiments certain other layers may be disposed between the transparent conductive layer 130 and the support 140, such as, for example, an anti-reflective layer or a bather layer (not shown).

In some embodiments, the transparent conductive layer 130 includes an electrically conductive layer (sometimes referred to in the art as a front contact layer) 132 disposed on the support 140, as indicated in FIG. 8. In some embodiments, the window layer 120 is disposed directly on the electrically conductive layer 132 (not shown). In alternate embodiments, the transparent conductive layer 130 includes an electrically conductive layer 132 disposed on the support 140 and an additional buffer layer 134 (optional) is interposed between the electrically conductive layer 132 and the window layer 120, as indicated in FIG. 8. In one embodiment, the transparent conductive layer 130 has a thickness in a range from about 100 nanometers to about 600 nanometers.

In some embodiments, the electrically conductive layer 132 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide (ZnSn$O_x$), or combinations thereof. Depending on the specific TCO employed and on its sheet resistance, the thickness of the electrically conductive layer 132 may be in a range of from about 50 nm to about 600 nm, in one embodiment.

In some embodiments, the photovoltaic device 100 further includes a buffer layer (optional), also called a higher resistance transparent (HRT) layer 134, interposed between the window layer 120 and the electrically conductive layer 132. In one embodiment, the thickness of the buffer layer 134 is in a range from about 50 nm to about 200 nm. Non-limiting examples of suitable materials for the buffer layer 124 include tin dioxide ($SnO_2$), zinc tin oxide (zinc-stannate (ZTO)), zinc-doped tin oxide ($SnO_2$:Zn), zinc oxide (ZnO), indium oxide ($In_2O_3$), or combinations thereof.

As described earlier, the semiconductor layer 110 includes a second region 114 and a first region 112. The first region 112 is disposed proximate to the window layer 120, as indicated in FIG. 8. In one embodiment, the photovoltaic device 100 further includes a back contact layer 150. In some embodiments, the back contact layer 150 is disposed proximate to the second region 114 of the semiconductor layer 110. In certain embodiments, another metal layer (not shown), for example, aluminum, may be disposed on the back contact layer 150 to provide lateral conduction to the outside circuit.

As noted, embodiments of the present invention may provide for efficient and stable photovoltaic devices. In some embodiments, a photovoltaic device includes a window layer; and a semiconductor layer disposed on window layer, wherein upon exposure to 1-sun illumination at open circuit at a temperature of about 65° C. for 56 days, an efficiency of the photovoltaic device decreases by less than about 5 percent relative to an initial value, and a normalized series resistance increases by less than about 1.0 ohm-$cm^2$.

In some embodiments, a method of making a photovoltaic device is presented. In some embodiments, the method of making a photovoltaic device 100 includes disposing a transparent layer 130 on a support 140. In some embodiments, the method includes disposing a transparent layer 130 including an electrically conductive layer 132 on a support 140, by any suitable technique, such as sputtering, chemical vapor deposition, spin coating, spray coating, or dip coating. Referring to FIG. 8, in some embodiments, an optional buffer layer 134 may be deposited on the electrically conductive layer 132, using sputtering to form the transparent layer 130. The window layer 120 may be then deposited on the transparent layer 130. Non-limiting examples of the deposition methods for the window layer 120 include one or more of close-space sublimation (CSS), vapor transport method (VTM), sputtering, and electrochemical bath deposition (CBD).

The method further includes disposing a semiconductor layer 110 on the window layer 120 by employing one or more methods selected from close-space sublimation (CSS), vapor transport method (VTM), ion-assisted physical vapor deposition (IAPVD), radio frequency or pulsed magnetron sputtering (RFS or PMS), plasma enhanced chemical vapor deposition (PECVD), and electrochemical deposition (ECD).

In some embodiments, the method of making a photovoltaic device further includes treating the semiconductor layer 110 using one or more of the aforementioned treatment techniques. The method further includes disposing a back contact layer 150 on the semiconductor layer 110 to complete the device, in some embodiments. One or more of the window layer 120, the semiconductor layer 110, the back contact layer 150 may be may be further heated or subsequently treated (for example, annealed) after deposition to manufacture the photovoltaic device 100.

In alternative embodiments, as illustrated in FIG. 9, a photovoltaic device 200 including a "substrate" configuration is presented. The photovoltaic device 200 includes a back contact layer 250 disposed on a support 240. Further, a semiconductor layer 210 is disposed on the back contact layer 250, and a window layer 220 is disposed on the semiconductor layer 210. As described earlier, the semiconductor layer 210 includes a second region 214 and a first region 212. The first region 212 is disposed proximate to the window layer 220. A transparent layer 230 is further disposed on the window layer 220. As illustrated in FIG. 9, in such embodiments, the solar radiation 30 enters from the transparent layer 230 and after passing through the window layer 220, enters the semiconductor layer 210, where the conversion of electromagnetic energy of incident light (for instance, sunlight) to electron-hole pairs (that is, to free electrical charge) occurs. In some embodiments, the composition of the layers illustrated in FIG. 9 may have the same composition as described above in FIG. 8 for the superstrate configuration.

In some embodiments, other components (not shown) may be included in the exemplary photovoltaic device 100/200, such as, buss bars, external wiring, laser etches, etc. For example, when the device 100/200 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100/200 to divide the device into a plurality of series connected cells. Some embodiments of the invention further include a photovoltaic module, including one or more photovoltaic devices 100/200 as described earlier.

EXAMPLES

Example 1

Preparation of CdTe/CdS/ZnO/CTO/Glass Sample

A multi-layered sample including CdTe was prepared by depositing cadmium tin oxide (CTO) on a glass support followed by deposition of zinc tin oxide (ZTO) layer on the CTO. Cadmium sulfide (CdS) was then deposited on the ZTO layer followed by deposition of cadmium telluride (CdTe) on the CdS layer to form CdTe/CdS/ZnO/CTO/glass sample.

Comparative Example 1

Cadmium Telluride Photovoltaic Device

A colloidal graphite paste was deposited on the CdTe layer of the CdTe/CdS/ZTO/CTO/glass sample of Example 1, followed by annealing of the device at 160° C. for 8 min. The device was completed by depositing a layer of nickel and a layer of aluminum.

Comparative Example 2

Cadmium Telluride Subjected to the First Copper Treatment Followed by $CdCl_2$ Treatment, Followed by the Second Copper Treatment The CdTe/CdS/ZTO/CTO/glass sample of Example 1 was immersed in an aqueous solution of copper (first copper treatment; 100 ppb, pH 2.5) at 65° C. for 2 minutes. The sample was then rinsed with de-ionized water and dried. The resulting sample was coated with cadmium chloride ($CdCl_2$) (100 g/L) and heat treated at 415° C. for 20 minutes. The $CdCl_2$ treated sample was rinsed for 2 minutes with de-ionized water followed by immersion in ethylene di-amine (EDA) at room temperature for 1 minute. The resulting sample was then rinsed with de-ionized water and dried. The $CdCl_2$-treated sample was immersed in an aqueous solution of copper (second copper treatment; 250 ppb, pH 4.5) at 65° C. for 2 minutes. The sample was then rinsed with de-ionized water and dried followed by deposition of colloidal graphite paste and annealing the device at 160° C. for 8 min. The device was completed by depositing a layer of nickel and a layer of aluminum.

Comparative Example 3

Cadmium Telluride Photovoltaic Device Subjected to Standard Copper and Back Contact Treatment The CdTe/CdS/ZTO/CTO/glass sample of Example 1 was subjected to standard $CdCl_2$/Cu/Conductive contact treatment to form a back contact.

Example 2

Figure 10:
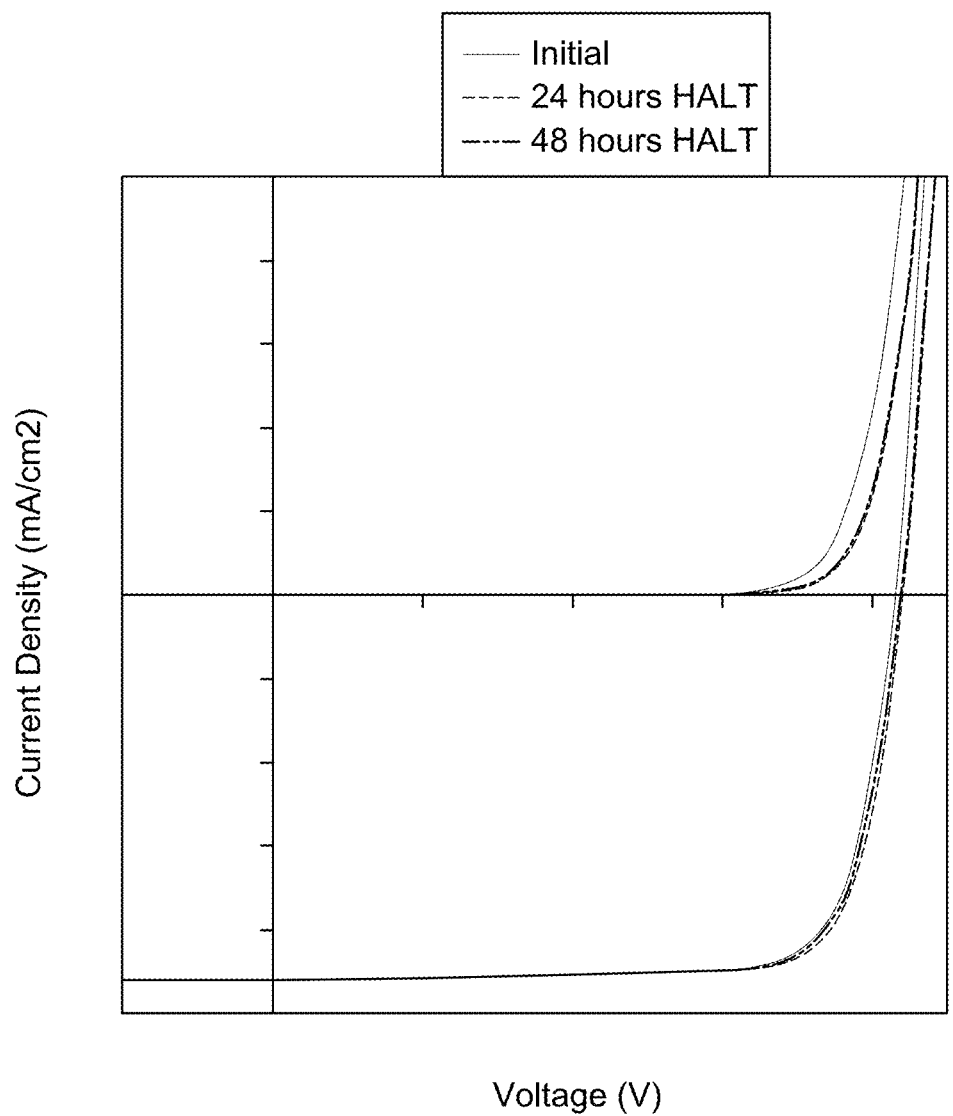
FIG. 10 is a plot of current density versus voltage for a photovoltaic device, according to some embodiments of the invention.

Cadmium Telluride Subjected to Sequential $CdCl_2$ and First Copper Treatment Followed by Sequential Iodine and Second Copper Treatment The CdTe/CdS/ZTO/CTO/glass sample of Example 1 was coated with cadmium chloride ($CdCl_2$) (100 g/L) and heat treated at 415° C. for 20 minutes. The $CdCl_2$-treated sample was rinsed for 2 minutes with de-ionized water followed by immersion in ethylene di-amine (EDA) at room temperature for 1 minute. The resulting sample was then rinsed with de-ionized water and dried. The $CdCl_2$-treated sample was then immersed in an aqueous solution of copper chloride (first copper treatment; 100 ppb, pH 2.5) at 65° C. for 2 minutes. The sample was then rinsed with de-ionized water and dried. The dried sample was baked for 4 minutes at 240° C. The resulting sample was immersed in an aqueous solution of iodine ($I_2$) (0.1 g/L, pH 2.5) at 65° C. for 2 minutes. The resulting sample was then immersed in an aqueous solution of copper chloride (second copper treatment; 250 ppb, pH 4.5) at 65° C. for 2 minutes. The sample was then rinsed with de-ionized water and dried followed by deposition of colloidal graphite paste and annealing the device at 160° C. for 8 min. The device was completed by depositing a layer of nickel and a layer of aluminum. FIG. 10 illustrates a graph of current density ($mA/cm^2$) versus voltage (V) for the photovoltaic device initially, and after subjecting the device to HALT (Highly Accelerated Life Testing) test conditions (exposure to 1-sun illumination at open circuit at 105° C.). Tables 1 and 2 show the normalized efficiency and stability data for photovoltaic device of Example 2 versus photovoltaic devices of Comparative Examples 1 and 2. As illustrated in FIG. 10 and Table 2, the photovoltaic device of Example 2 showed higher efficiency values and better stability performance as compared to photovoltaic devices of Comparative Examples 1 and 2.

TABLE 1

Initial and Post-HALT photovoltaic device performance characteristics for photovoltaic device (Example 2)

|  | Normalized Efficiency [%] | Normalized $V_{oc}$ [V] | Normalized $J_{sc}$ [$mA/cm^2$] | Normalized $R_{oc}$ [Ohms] | Normalized FF |
|---|---|---|---|---|---|
| Initial | 1.00 | 1.00 | 1.00 | 1.00 | 1.00 |
| 24 hours HALT | 1.02 | 1.01 | 1.00 | 1.09 | 1.01 |
| 48 hours HALT | 1.00 | 1.01 | 1.00 | 1.09 | 1.00 |

TABLE 2

Initial and Post-HALT Efficiency data for photovoltaic devices

| Example | Normalized Initial Efficiency [%] | Normalized Post HALT Efficiency [%] |
|---|---|---|
| Example 2 | 1.00 | 1.00 |
| Comparative Example 1 | 0.34 | 0.27 |
| Comparative Example 2 | 0.86 | 0.80 |

Figure 11:
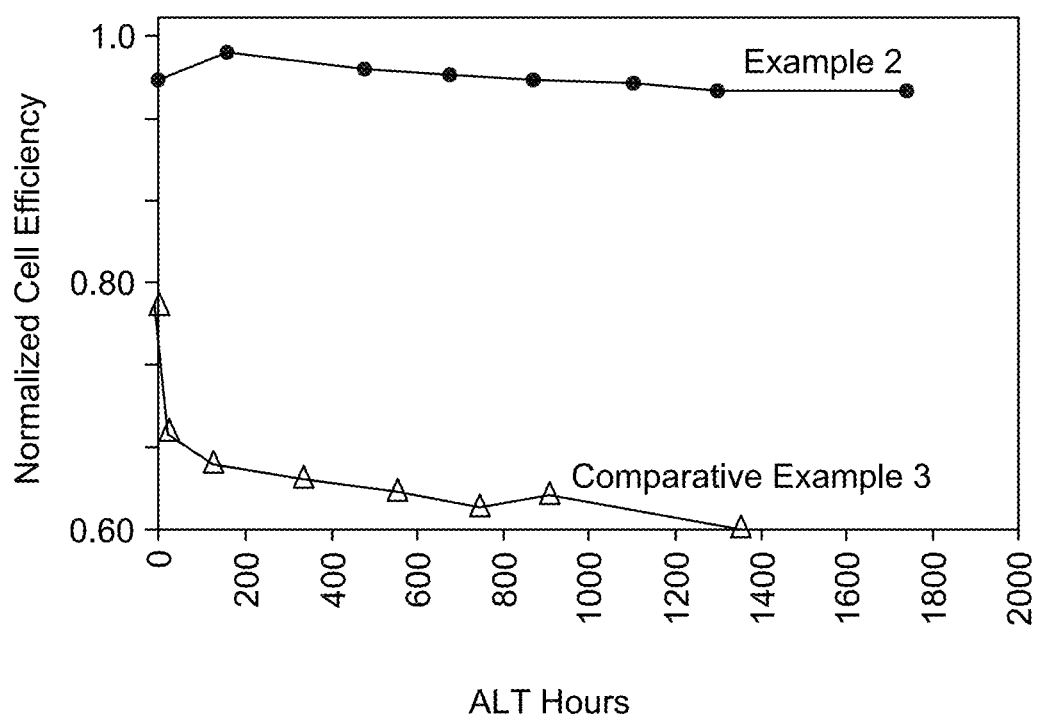
FIG. 11 is plot of efficiency versus accelerated life testing (ALT) hours for a photovoltaic devices prepared in accordance with some embodiments of the invention and a comparative sample.

FIG. 11 further illustrates the normalized efficiency and stability data for photovoltaic device of Example 2 versus photovoltaic device of Comparative Example 3 (standard $CdCl_2$/Cu back contact). As illustrated in FIG. 11, the photovoltaic device of Example 2 showed higher efficiency values and better stability performance as compared to the photovoltaic device of Comparative Example 3.

Example 3

Figure 12:
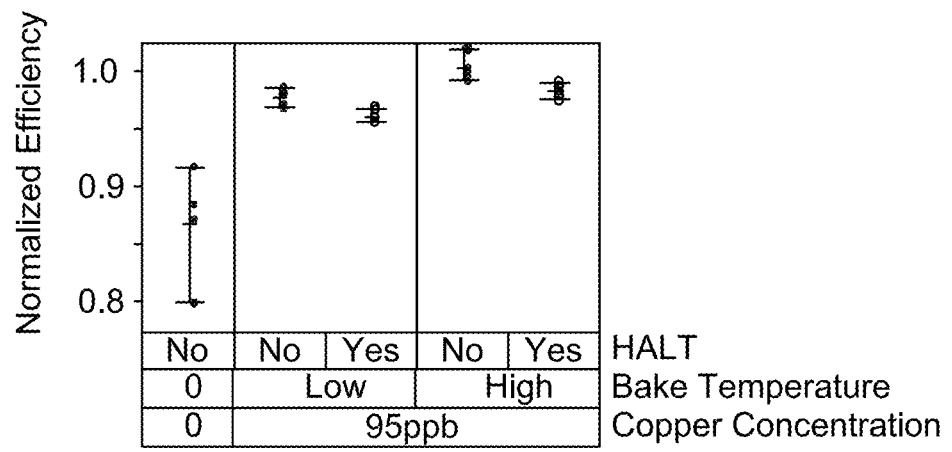
FIG. 12 shows the effect of treatment conditions on the efficiency, according to some embodiments of the invention.

Cadmium Telluride Subjected to Sequential $CdCl_2$ and First Copper Treatment Followed by Simultaneous Iodine and Second Copper Treatment The CdTe/CdS/ZTO/CTO/glass sample of Example 1 was coated with cadmium chloride ($CdCl_2$) (100 g/L) and heat treated at 415° C. for 20 minutes. The $CdCl_2$ treated sample was rinsed for 2 minutes with de-ionized water followed by immersion in ethylene di-amine (EDA) at room temperature for 1 minute. The resulting sample was then rinsed with de-ionized water and dried. The $CdCl_2$-treated sample was then immersed in an aqueous solution of copper chloride (first copper treatment; 95 ppb, pH 2.5) at 65° C. for 2 minutes. The sample was then rinsed with de-ionized water and dried. The dried sample was baked for 4 minutes at low and high bake temperatures. The resulting samples were immersed in an aqueous solution of iodine ($I_2$) (0.1 g/L, pH 2.5) and copper chloride (second copper treatment; 250 ppb, pH 4.5) at 65° C. for 2 minutes. The samples were then rinsed with de-ionized water and dried followed by deposition of colloidal graphite paste and annealing the device at 160° C. for 8 min. The devices were completed by depositing a layer of nickel and a layer of aluminum. FIG. 12 illustrates the normalized efficiency values for the photovoltaic devices initially, and after subjecting the device to HALT test conditions. The efficiency and stability data achieved is comparable to the efficiency and stability data of photovoltaic device of Example 2.

Example 4

Cadmium Telluride Subjected to $CdCl_2$ Treatment Followed by Simultaneous Iodine and Second Copper Treatment (No First Copper Treatment)

The CdTe/CdS/ZTO/CTO/glass sample of Example 1 was coated with cadmium chloride ($CdCl_2$) (100 g/L) and heat treated at 415° C. for 20 minutes. The CdCl$_2$ treated sample was rinsed for 2 minutes with de-ionized water followed by immersion in ethylene di-amine (EDA) at room temperature for 1 minute. The resulting sample was then rinsed with de-ionized water and dried. The CdCl$_2$-treated sample was then immersed in an aqueous solution of iodine (I$_2$) (0.1 g/L, pH 2.5) and copper chloride (second copper treatment; 250 ppb, pH 4.5) at 65° C. for 2 minutes. The sample was then rinsed with de-ionized water and dried followed by deposition of colloidal graphite paste and annealing the device at 160° C. for 8 min. The device was completed by depositing a layer of nickel and a layer of aluminum. FIG. 12 illustrates the normalized efficiency values for the photovoltaic devices initially as well as after subjecting the device to HALT test conditions.

As illustrated in FIG. 12, samples that were not subjected to the first copper treatment (Example 4) had lower efficiency values versus samples subjected to both the first copper treatment and the second copper treatment (Example 3). However, the samples that were not subjected to the first copper treatment (Example 4) had improved efficiency when compared to samples subjected to standard back contact copper treatment (Comparative Example 3). FIG. 12 further illustrates the effect of annealing temperatures (200° C., 250° C.) employed during the first copper treatment on the efficiency and stability performance of the photovoltaic devices.

Example 5

Effect of Copper Concentration in the First Copper Treatment and in the Second Copper Treatment on Efficiency and Stability Data The CdTe/CdS/ZTO/CTO/glass sample of Example 1 was immersed in an aqueous solution of copper chloride at two different concentrations (first copper treatment; 100 ppb, 200 ppb) at 65° C. for 2 minutes. The resulting sample was sprayed with cadmium chloride (CdCl$_2$) solution (100 g/L) and heat treated at 390° C. for 20 minutes. The CdCl$_2$-treated sample was rinsed for 2 minutes with de-ionized water followed by immersion in ethylene di-amine (EDA) at room temperature for 1 minute. The resulting samples were then rinsed with de-ionized water and dried. The CdCl$_2$-treated samples were then immersed in an aqueous solution of iodine (I$_2$) (0.1 g/L) and copper chloride at two different concentrations (100 ppb, 200 ppb) at 65° C. for 2 minutes. The samples were then rinsed with de-ionized water and dried followed by deposition of colloidal graphite paste and annealing the devices at 145° C. for 14 minutes. The devices were completed by depositing a layer of nickel and a layer of aluminum.

Figure 13:
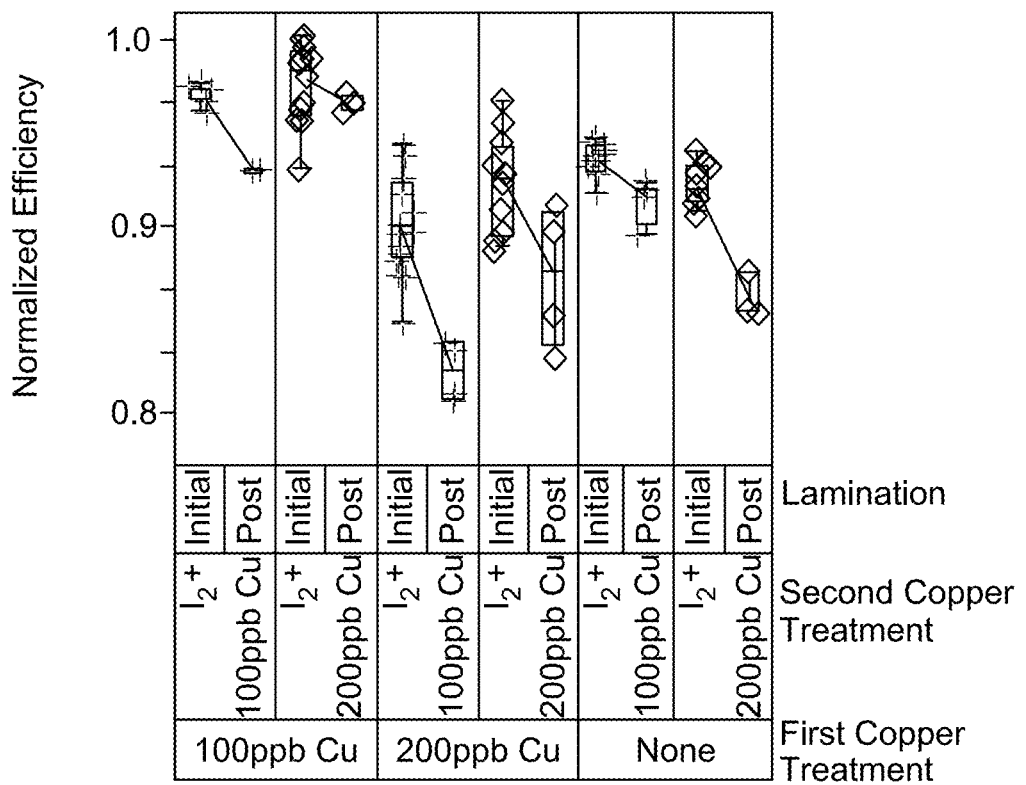
FIG. 13 shows the effect of treatment conditions on the efficiency, according to some embodiments of the invention.

FIG. 13 illustrates the normalized efficiency values for the photovoltaic devices initially as well as after subjecting the device to HALT test conditions. FIG. 13 illustrates the effect of copper concentration employed during the first copper treatment and the second copper treatment on the efficiency and stability performance of the photovoltaic devices.

Example 6

Cadmium Telluride Subjected to CdCl$_2$ Treatment Followed by Iodine Treatment (No First Copper and Second Copper Treatment) Versus Simultaneous Iodine and Copper Treatment (No First Copper Treatment)

The CdTe/CdS/ZTO/CTO/glass sample of Example 1 was sprayed with cadmium chloride (CdCl$_2$) (100 g/L) and heat treated at 390° C. for 20 minutes. The CdCl$_2$ treated sample was rinsed for 2 minutes with de-ionized water followed by immersion in ethylene di-amine (EDA) at room temperature for 1 minute. The resulting sample was then rinsed with de-ionized water and dried. The CdCl$_2$-treated sample was then immersed in an aqueous solution of: iodine (I$_2$) (0.1 g/L, pH 2.5) or an aqueous solution of I$_2$ and copper chloride (50 ppb, 100 ppb, 200 ppb, and 400 ppb) at 65° C. for 2 minutes. The sample were then rinsed with de-ionized water and dried followed by deposition of colloidal graphite paste and annealing the devices at 145° C. for 14 minutes. The devices were completed by depositing a layer of nickel and a layer of aluminum. Some samples were further subjected to lamination bake for 14 minutes at 145° C.

Figure 14:
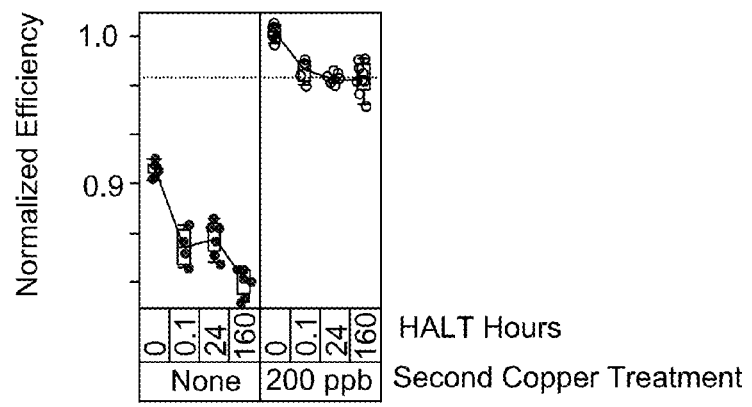
FIG. 14 shows the effect of treatment conditions on the efficiency, according to some embodiments of the invention.

FIG. 14 illustrates the normalized efficiency values for the photovoltaic devices initially as well as after subjecting the device to HALT test conditions. As illustrated in FIG. 14, samples that were only subjected to I$_2$ treatment had lower efficiency values versus samples subjected to both I$_2$ and second copper treatment. Further, the second copper treatment resulted in improved HALT performance.

Example 7

Effect of Copper Concentration on Cadmium Telluride Subjected to Sequential Iodine and Second Copper Treatment Versus Simultaneous Iodine and Second Copper Treatment The CdTe/CdS/ZTO/CTO/glass sample of Example 1 was coated with cadmium chloride (CdCl$_2$) (100 g/L) and heat treated at 415° C. for 20 minutes. The CdCl$_2$-treated sample was rinsed for 2 minutes with de-ionized water followed by immersion in ethylene di-amine (EDA) at room temperature for 1 minute. The resulting sample was then rinsed with de-ionized water and dried. The resulting sample was then subjected to simultaneous or sequential treatment with I$_2$ (0.1 g/L) and copper at different concentrations (190 ppb, 290 ppb, 380 ppb, 760 ppb, 1900 ppb), at 65° C. for 2 minutes. The samples were then rinsed with de-ionized water and dried followed by deposition of colloidal graphite paste and annealing the device at 160° C. for 8 min. The devices were completed by depositing a layer of nickel and a layer of aluminum.

Figure 15:
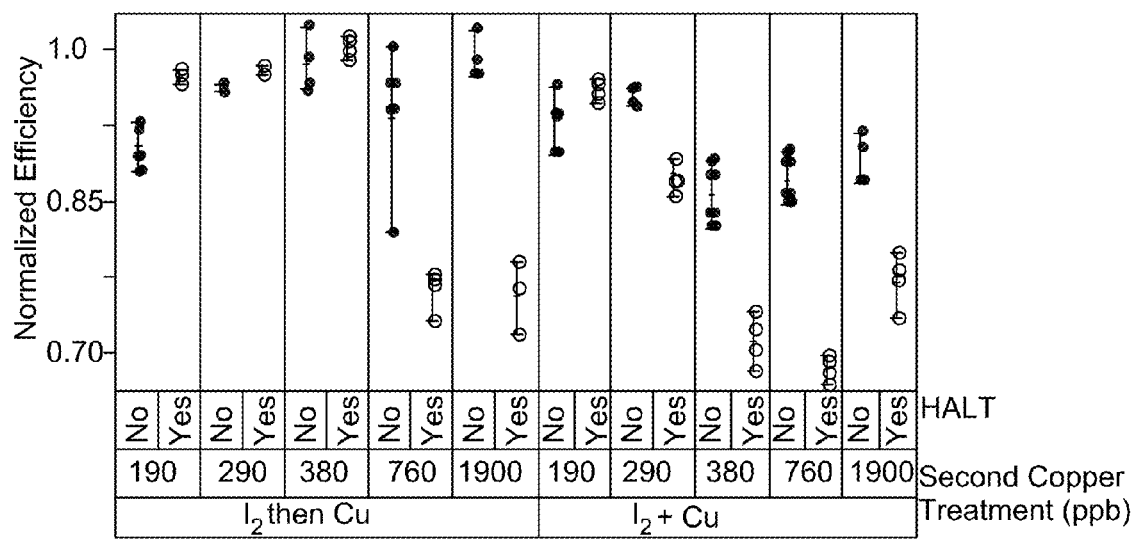
FIG. 15 shows the effect of treatment conditions on the efficiency, according to some embodiments of the invention.

FIG. 15 illustrates the normalized efficiency values for the photovoltaic devices initially as well as after subjecting the device to HALT test conditions. As illustrated in FIG. 15, sequential treatment of I$_2$ and Cu resulted in improved efficiency when compared to simultaneous treatment with I$_2$ and Cu. Further, higher concentration (e.g., 1900 ppb) of copper resulted in devices with poor HALT performance.

Example 8

Effect of Iodine Concentration on Efficiency and Stability Data

The CdTe/CdS/ZTO/CTO/glass sample of Example 1 was coated with cadmium chloride (CdCl$_2$) (100 g/L) and heat treated at 415° C. for 20 minutes. The CdCl$_2$-treated sample was rinsed for 2 minutes with de-ionized water followed by immersion in ethylene di-amine (EDA) at room temperature for 1 minute. The resulting sample was then rinsed with de-ionized water and dried. The resulting sample was then subjected sequential treatment with I$_2$ at different concentrations (0.036 g/L, 0.203 g/L, 0.514 g/L, and 0.1 g/L) and copper (350 ppb), at 65° C. for 2 minutes. The samples were then rinsed with de-ionized water and dried followed by deposition of colloidal graphite paste and annealing the device at 240° C. for 8 min. The devices were completed by depositing a layer of nickel and a layer of aluminum.

Figure 16:
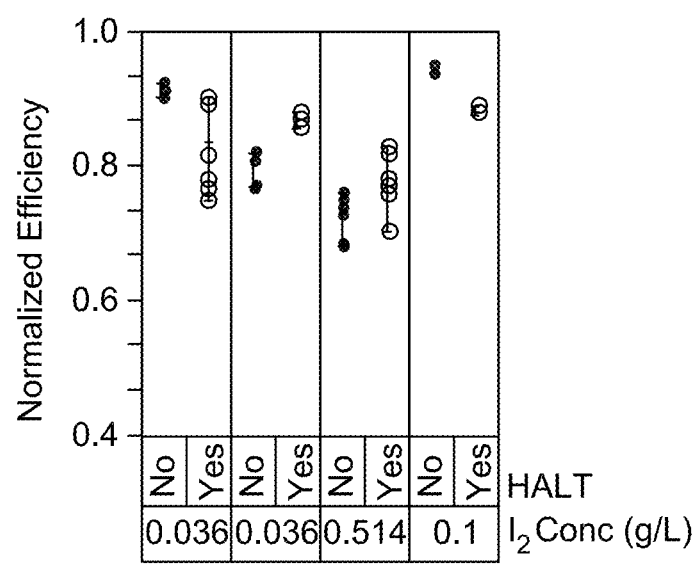
FIG. 16 shows the effect of treatment conditions on the efficiency, according to some embodiments of the invention.

FIG. 16 illustrates the normalized efficiency values for the photovoltaic devices initially as well as after subjecting the device to HALT test conditions. As illustrated in FIG. 16, $I_2$ concentration affected the efficiency and stability of photovoltaic devices. Further, higher concentration (e.g., 0.5 g/L) of $I_2$ resulted in devices with lower efficiency values and reduced stability.

Example 9

Tellurium-Enriched Layer in Cadmium Telluride Subjected to $I_2$ Treatment

Figure 17B:
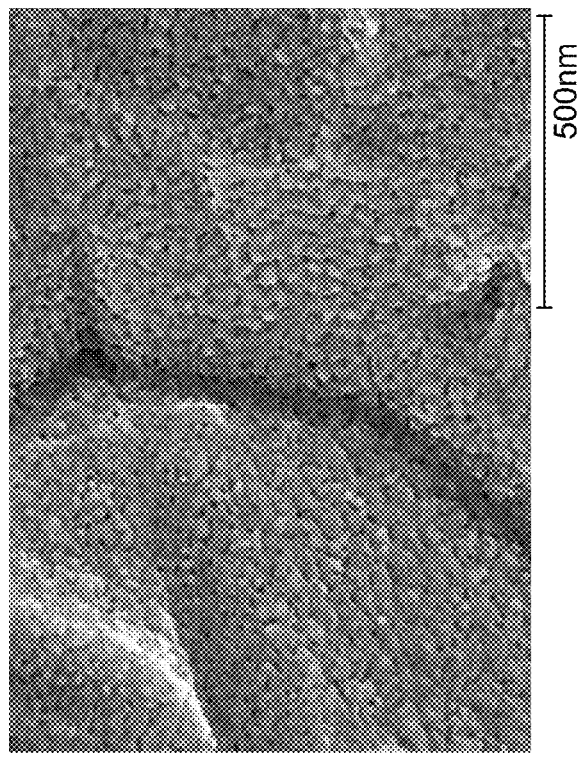
FIG. 17B is a scanning electron micrograph of a CdTe layer treated with a tellurium-enriching chemical agent.
Figure 17A:
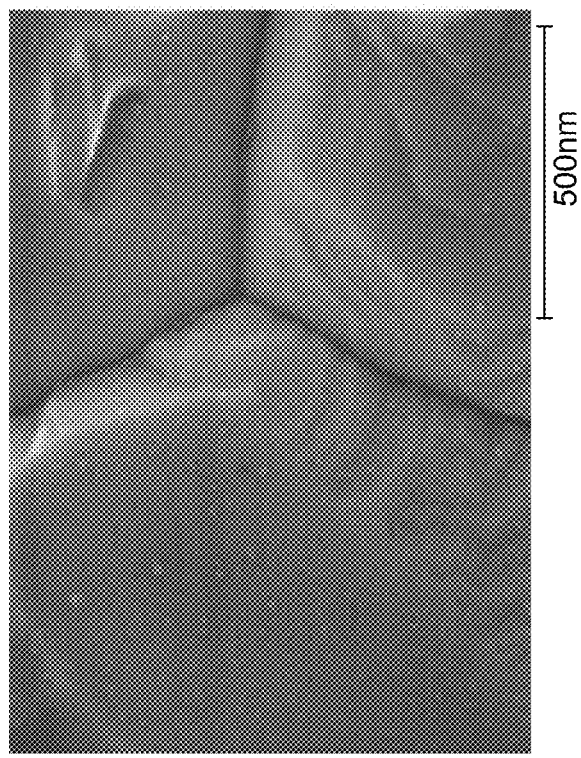
FIG. 17A is a scanning electron micrograph of an untreated CdTe layer.

FIG. 17A shows the scanning electron micrograph of a surface of an untreated CdTe film. FIG. 17B shows the scanning electron micrograph of a surface of Sample 2 (treated with $I_2$). As illustrated in FIGS. 17A and 17B, there is no substantial effect of the $I_2$ treatment on the grain boundaries of CdTe films when treated with $I_2$, whereas the bulk of the grain are substantially etched with $I_2$ treatment.

Figure 18A:
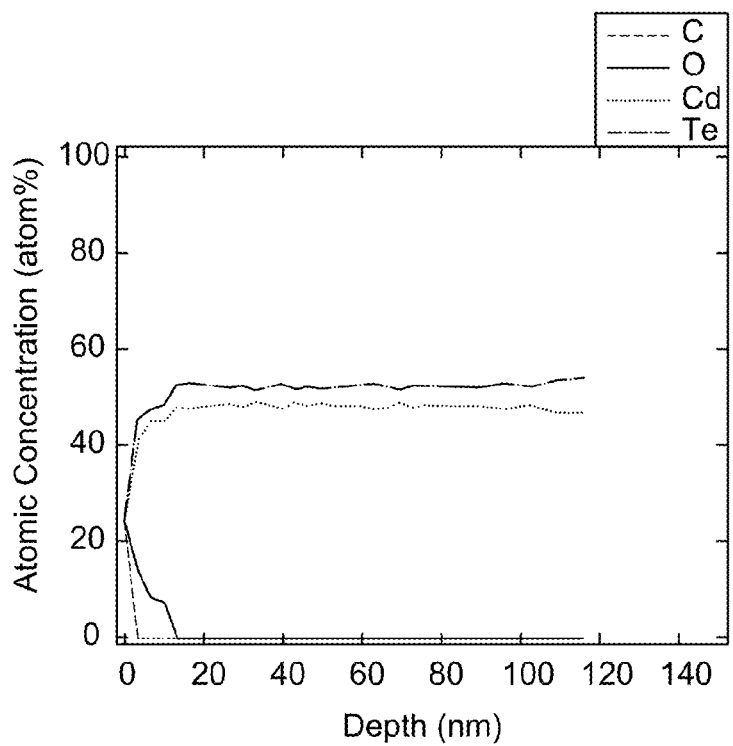
FIG. 18A is an XPS profile of an untreated CdTe layer.
Figure 18B:
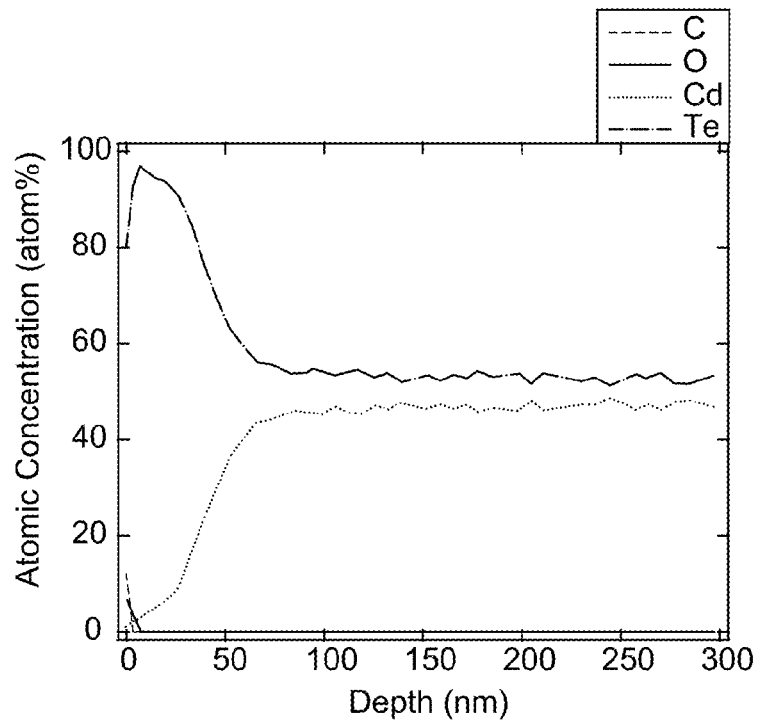
FIG. 18B is an XPS profile of a CdTe layer, according to some embodiments of the invention.
Figure 19:
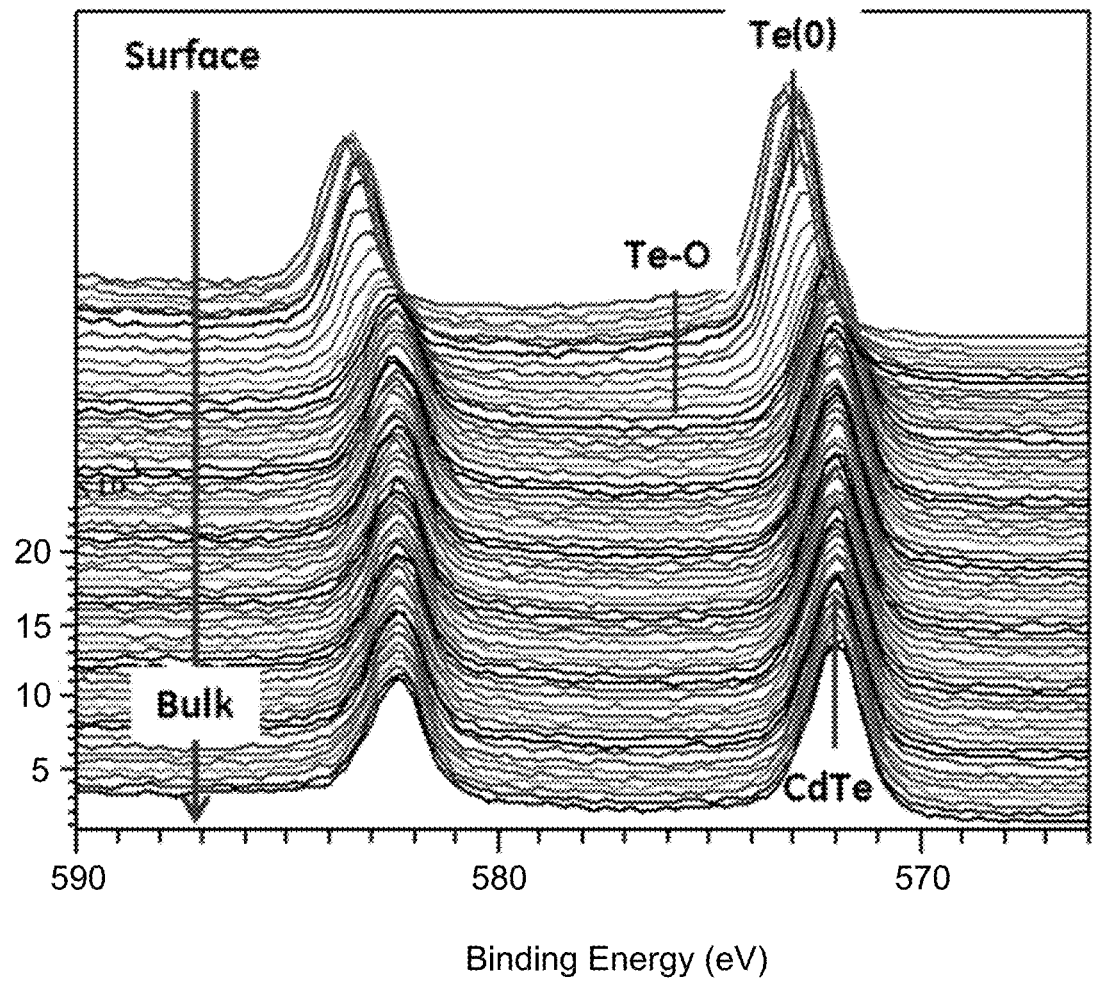
FIG. 19 shows the presence of elemental tellurium in tellurium-rich region
Figure 20:
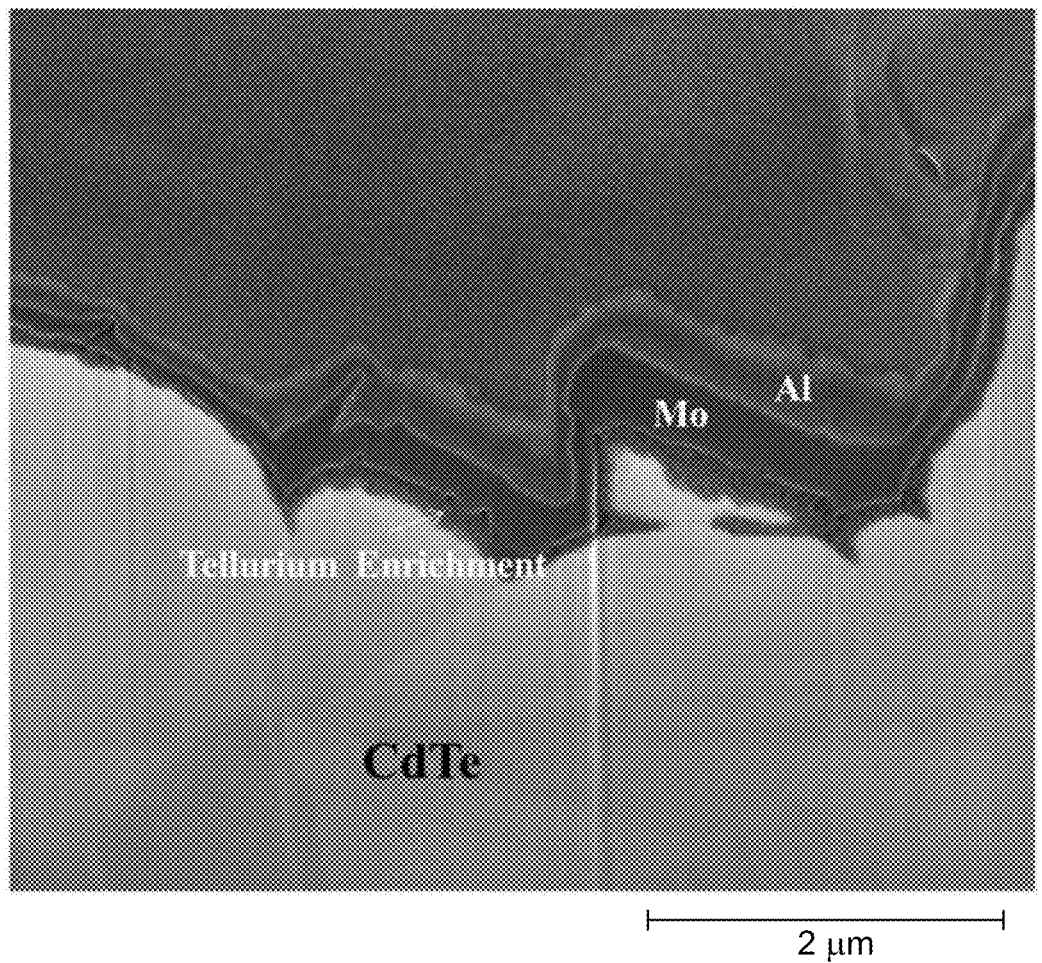
FIG. 20 is a micrograph showing the formation of tellurium-rich region.
Figure 21:
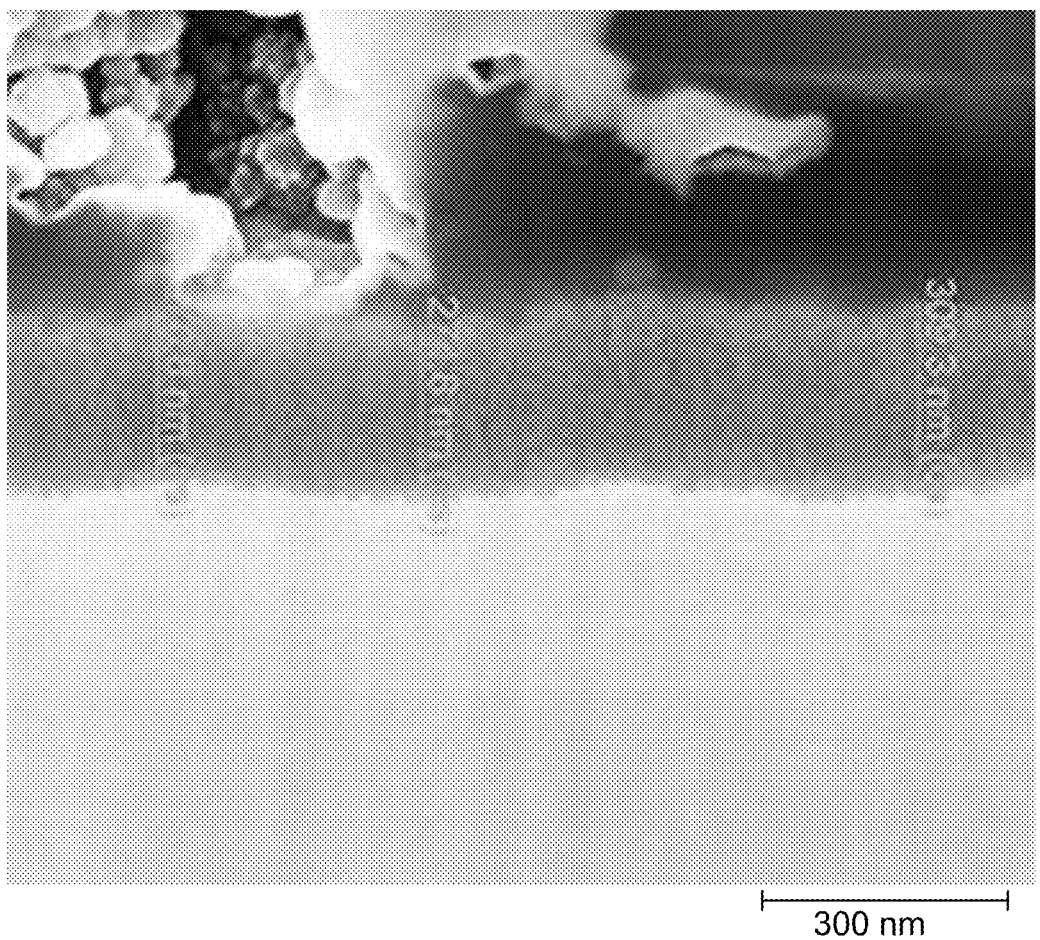
FIG. 21 is a micrograph showing the formation of tellurium-rich region.

X-ray photoelectron spectroscopy (XPS) was used to determine the concentration profile of cadmium and tellurium in Example 2 when compared to the untreated CdTe layer. As illustrated in FIG. 18A, the untreated CdTe layer includes a stoichiometric concentration of cadmium and tellurium, and further the relative concentration of cadmium to tellurium does not vary across the thickness. As illustrated in FIG. 18B, cadmium was depleted and tellurium was enriched near the surface of the CdTe layer for Example 2. Thus, as illustrated in FIG. 18B, treatment with $I_2$ results in formation of a tellurium-rich region, for example, having a thickness of about 100 nm FIG. 19 shows that the tellurium-rich region includes elemental tellurium (Te(0)) along with Te—O. FIGS. 20 and 21 further show a tellurium-rich layer formed at the interface between the CdTe and the back contact layer.

Figure 22:
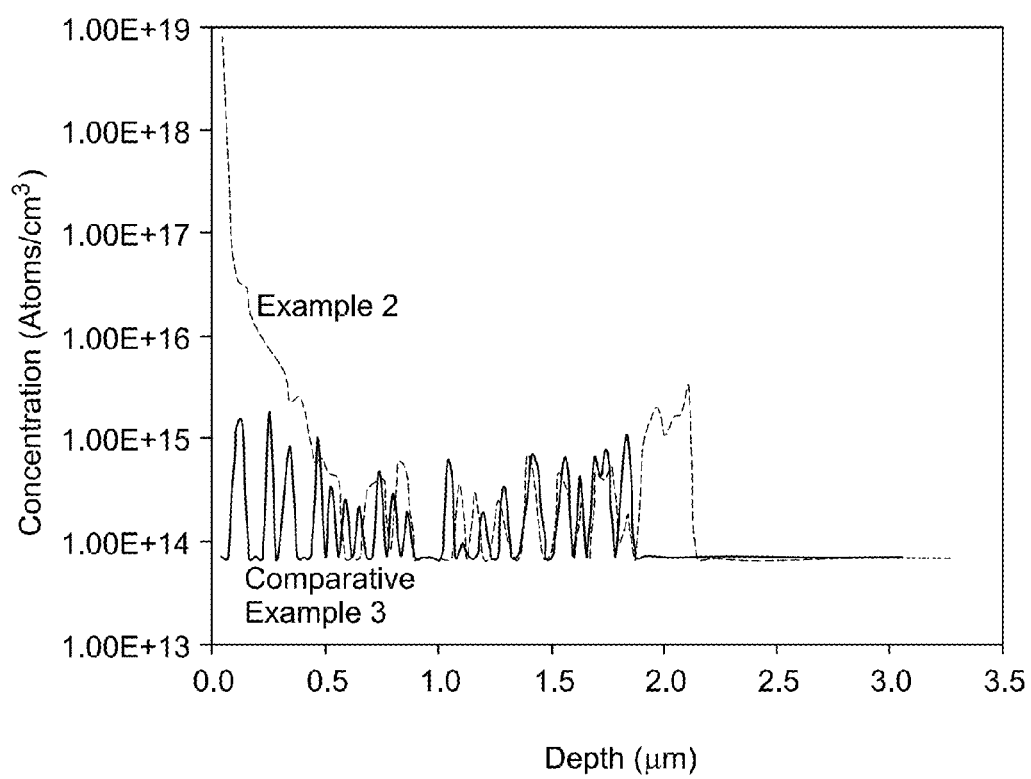
FIG. 22 shows the secondary ion mass spectrometry (SIMS) concentration profiles of iodine atoms in CdTe samples prepared in accordance with some embodiments of the invention and a comparative sample.

Secondary ion mass spectrometry (SIMS) was used to determine the concentration profile of iodine in the cadmium telluride layer. FIG. 22 shows the SIMS profiles of Example 2 and Comparative Example 1. As illustrated in FIG. 22, the sample subjected to a $I_2$ treatment resulted in a CdTe layer with $I_2$ content. Further, as illustrated in FIG. 22, the SIMS profile of Example 2 show that the concentration of $I_2$ in the CdTe layer varies across the thickness.

Example 10

Figure 23A:
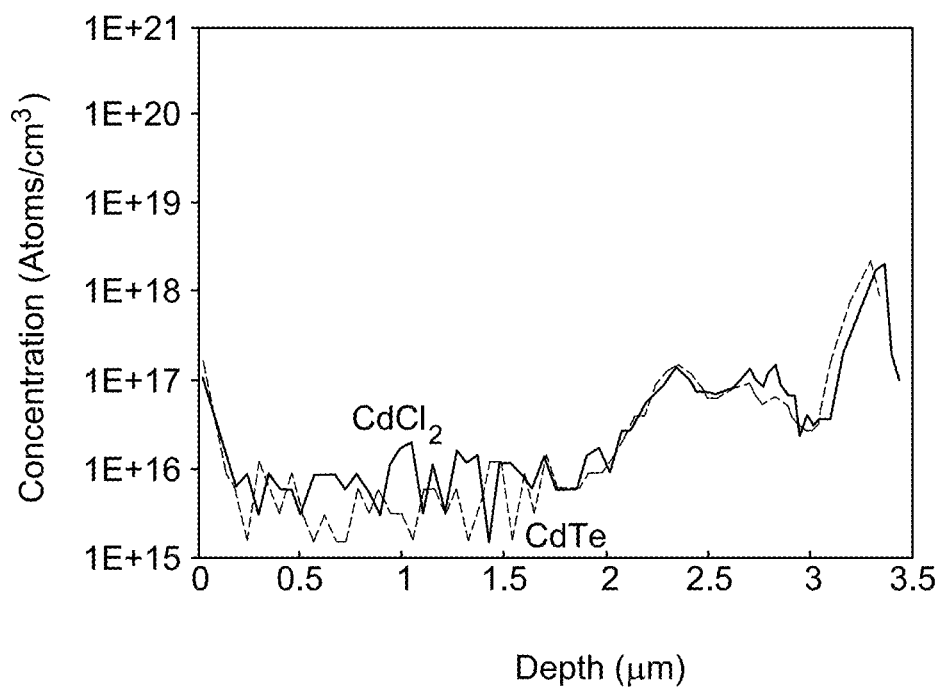
FIG. 23A shows the concentration of copper as a function of depth for a treated CdTe layer, according to some embodiments of the invention.
Figure 23B:
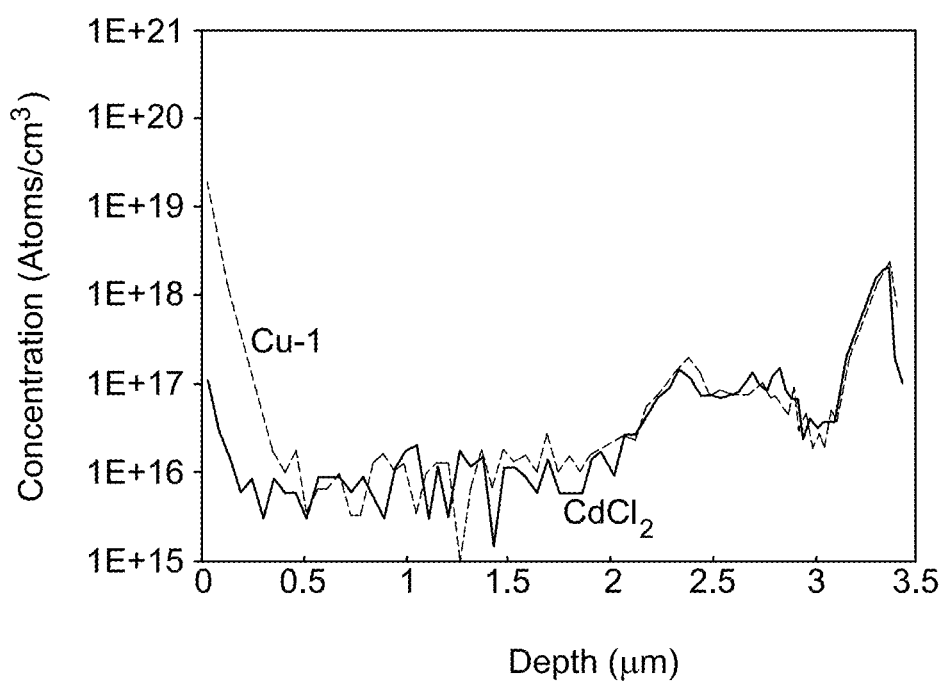
FIG. 23B shows the concentration of copper as a function of depth for a treated CdTe layer, according to some embodiments of the invention.
Figure 23C:
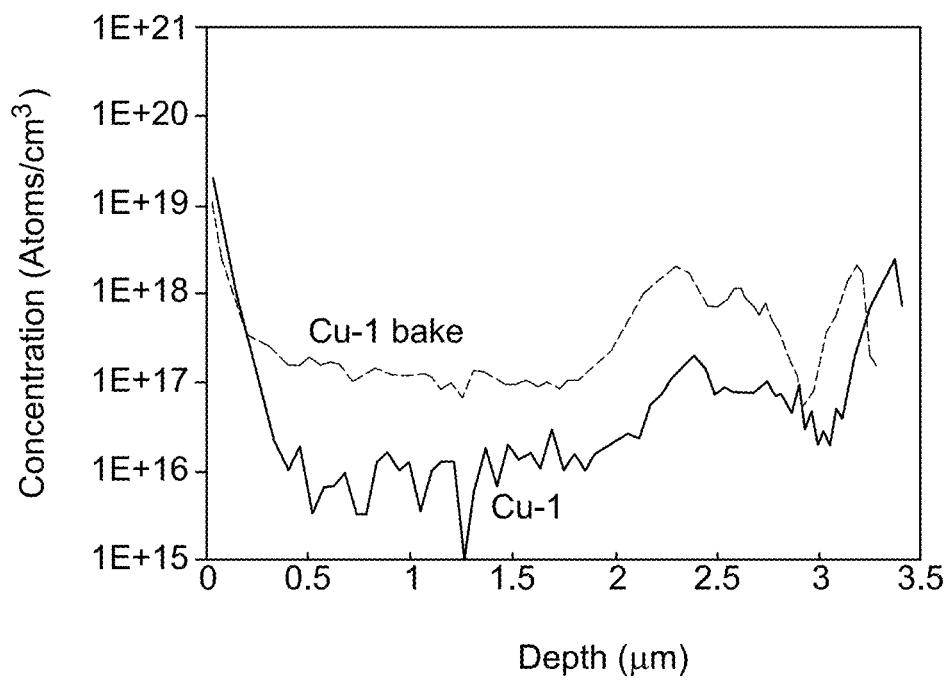
FIG. 23C shows the concentration of copper as a function of depth for a treated CdTe layer, according to some embodiments of the invention.
Figure 23D:
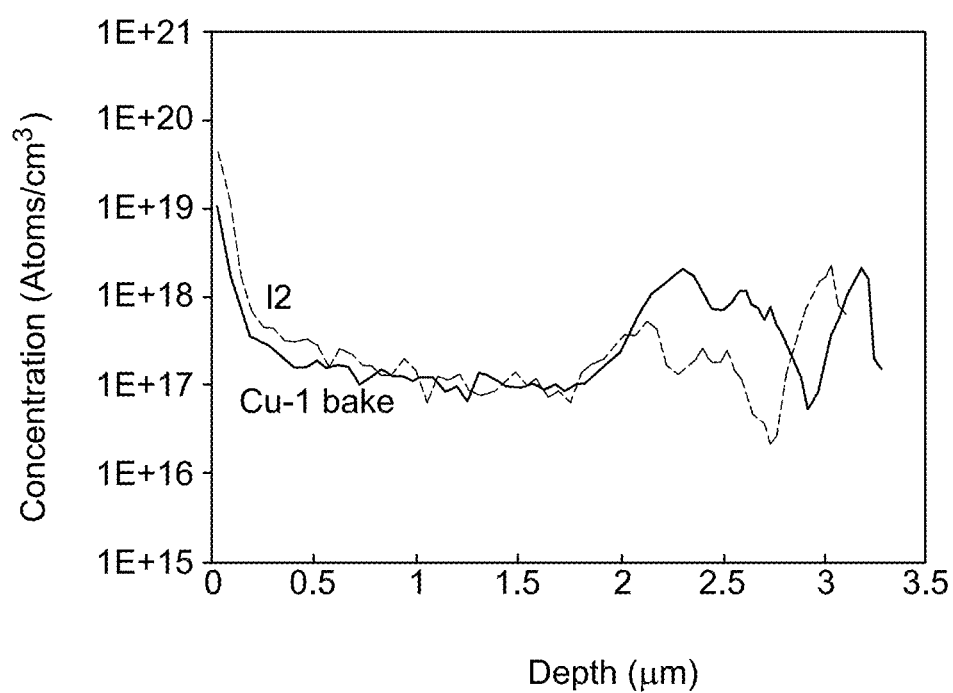
FIG. 23D shows the concentration of copper as a function of depth for a treated CdTe layer, according to some embodiments of the invention.

Copper Depth Profile in Cadmium Telluride Subjected to Different Copper Treatments Secondary ion mass spectrometry (SIMS) was used to determine the concentration profile of copper (Cu) in the CdTe layer after the different process steps of Example 2. As illustrated in FIG. 23A, $CdCl_2$ layer subjected to $CdCl_2$ treatment and the untreated CdTe layer show a similar profile of Cu in the CdTe layer. Further, the step of subjecting the CdTe layer to the first copper treatment (Cu-1), resulted in incorporation of copper at the surface of the CdTe layer, as illustrated in FIG. 23B. The first copper treatment step followed by bake (Cu-1 bake) resulted in greater incorporation of Cu into the bulk of the CdTe layer, as illustrated in FIG. 23C. FIG. 23D illustrates that the copper profile after the $I_2$ treatment step was substantially similar to the copper profile before the $I_2$ treatment step. Table 3 further shows the percentage atomic composition of the CdTe layer subjected to different treatment steps.

TABLE 3

| | Percentage atomic composition of CdTe layer | | | | | | | |
|---|---|---|---|---|---|---|---|---|
| | C | Cd | Cl | Cu | I | O | Te | Te/Cd |
| After first copper treatment and bake | 25.1 | 23.4 | 1.5 | 0.7 | ND | 26.8 | 22.6 | 0.96 |
| After $I_2$ treatment | 16.0 | 1.0 | ND | ND | 0.2 | 6.6 | 76.1 | 100 |

ND—Not detected

Figure 23E:
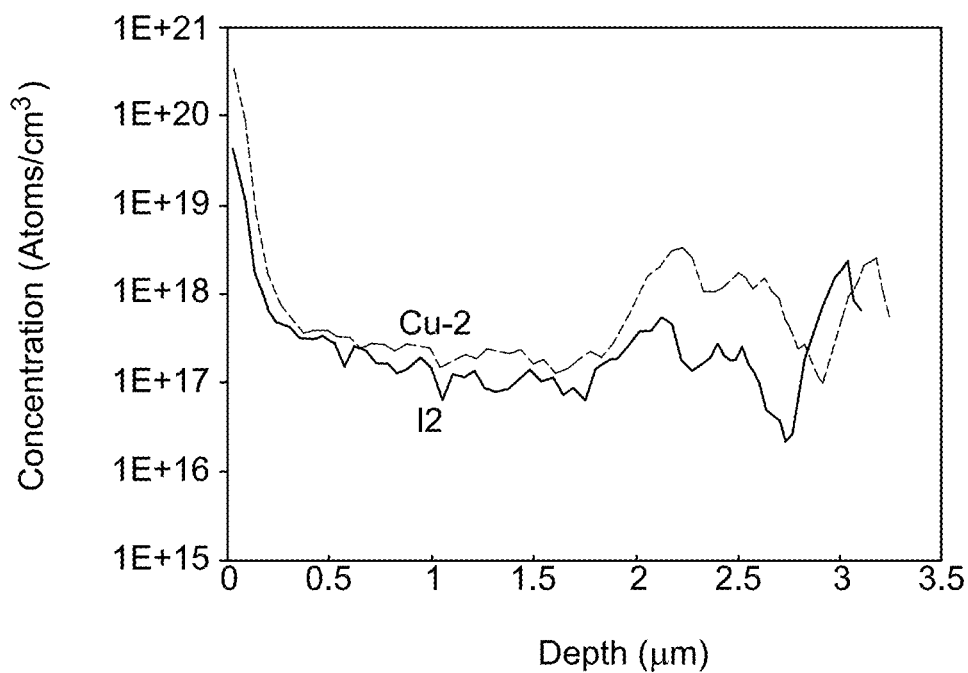
FIG. 23E shows the concentration of copper as a function of depth for a treated CdTe layer, according to some embodiments of the invention.
Figure 23F:
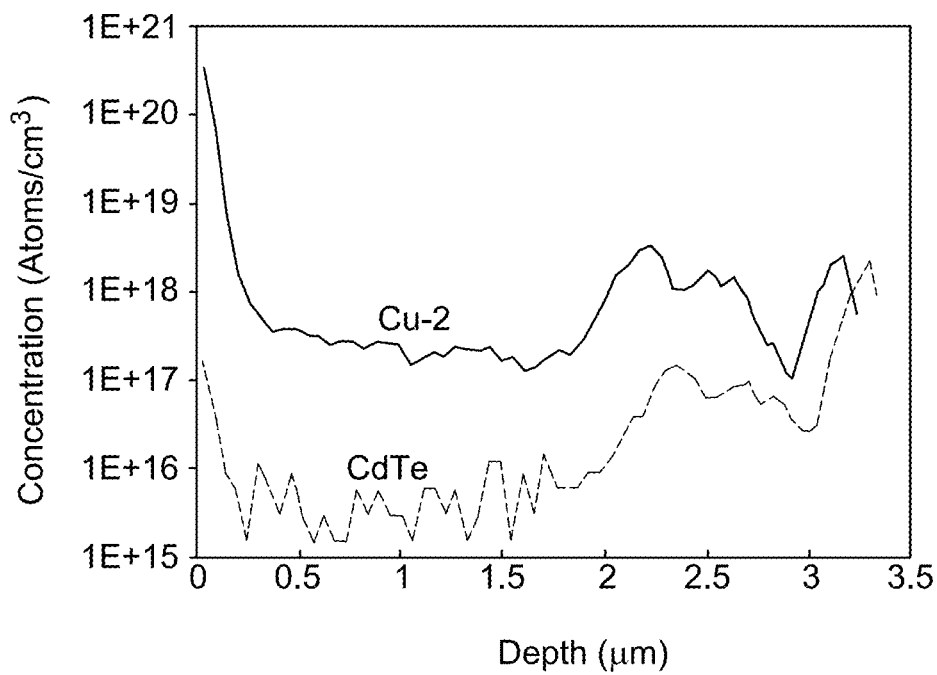
FIG. 23F shows the concentration of copper as a function of depth for a treated CdTe layer, according to some embodiments of the invention.

The second copper treatment step (Cu-2) resulted in greater incorporation of Cu into the surface of the CdTe layer, as illustrated in FIG. 23E. Further, FIG. 23F shows the copper depth profile in the CdTe layer of Example 2 versus an untreated CdTe layer.

Example 11

Figure 24:
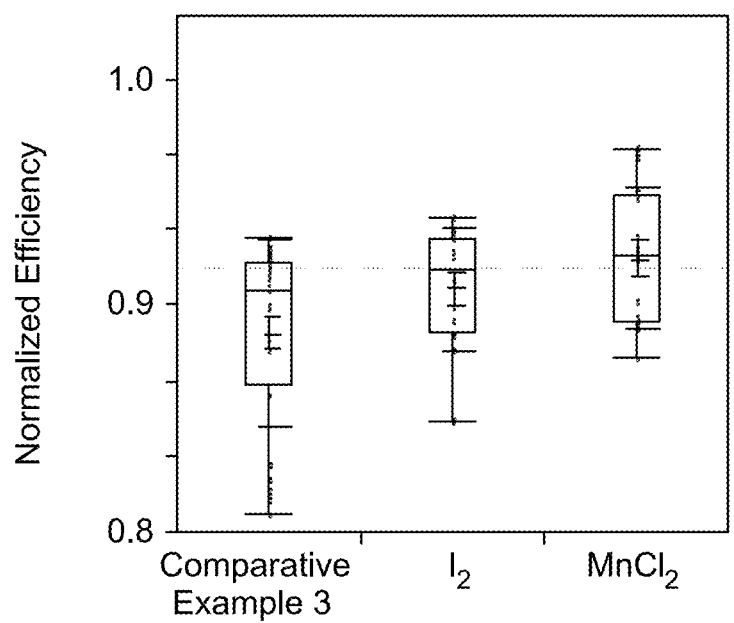
FIG. 24 shows the effect of treatment conditions on the efficiency, according to some embodiments of the invention.

Cadmium Telluride Subjected to First Copper Treatment Followed by Iodine or Managnese Chloride Treatment The CdTe/CdS/ZTO/CTO/glass sample of Example 1 was coated with cadmium chloride ($CdCl_2$) (100 g/L) and heat treated at 415° C. for 20 minutes. The $CdCl_2$-treated sample was rinsed for 2 minutes with de-ionized water followed by immersion in ethylene di-amine (EDA) at room temperature for 1 minute. The resulting sample was then rinsed with de-ionized water and dried. The $CdCl_2$-treated sample was then immersed in an aqueous solution of manganese chloride tetrahydrate ($MnCl_2.4H_2O$, 100 g/L, 50 ppb copper) at 22° C. for 2 minutes. The sample was then rinsed with de-ionized water and dried. The resulting sample was immersed in an aqueous solution of iodine ($I_2$) (0.1 g/L, pH 2.5) or manganese chloride tetrahydrate ($MnCl_2.4H_2O$, 600 g/L) at 65° C. for 2 minutes. The samples were then rinsed with de-ionized water and dried followed by deposition of colloidal graphite paste and annealing the device at 160° C. for 8 min. The devices were completed by depositing a layer of nickel and a layer of aluminum. FIG. 24 illustrates the normalized efficiency values for the photovoltaic devices of Example 11 ($I_2$ or $MnCl_2$-treated), and Comparative Example 3. As illustrated in FIG. 24, the efficiencies values achieved for the devices of Example 10 are comparable, and further the efficiency values for the devices of Example 10 is better than the efficiency value for the device of Comparative Example 3.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of:" Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A photovoltaic device, comprising:
a window layer;
a semiconductor layer comprising a semiconductor material disposed on the window layer, wherein the semiconductor layer comprises a first region and a second region, the first region disposed in a layer proximate to the window layer, and the second region comprising a chalcogen-rich region disposed in a layer proximate to the first region,
wherein the first region and the second region comprise a dopant, and an average atomic concentration of the dopant in the second region is greater than an average atomic concentration of the dopant in the first region.

2. The photovoltaic device of claim 1, wherein the dopant in the first region comprises copper, silver, gold, or combinations thereof.

3. The photovoltaic device of claim 1, wherein a concentration of the dopant in the first region is substantially constant across the thickness of the first region.

4. The photovoltaic device of claim 1, wherein the second region comprises a tellurium-rich region.

5. The photovoltaic device of claim 4, wherein an atomic ratio of tellurium to cadmium in the tellurium-rich region is greater than about 2.

6. The photovoltaic device of claim 4, wherein an atomic ratio of tellurium to cadmium in the tellurium-rich region is greater than about 10.

7. The photovoltaic device of claim 4, wherein the second region further comprises a copper dopant.

8. The photovoltaic device of claim 1, wherein the chalcogen-rich region has a thickness in a range from about 10 nanometers to about 1000 nanometers.

9. The photovoltaic device of claim 1, wherein the dopant in the second region comprises copper, silver, gold, or combinations thereof.

10. The photovoltaic device of claim 1, wherein an average atomic concentration of the dopant in the second region is greater than about $5 \times 10^{18}$ atoms/cm$^3$.

11. The photovoltaic device of claim 1, wherein a ratio of the average atomic concentration of the dopant in the second region to the average atomic concentration of the dopant in the first region is greater than about 10.

12. The photovoltaic device of claim 1, wherein the semiconductor material comprises cadmium telluride, magnesium telluride, mercury telluride, lead telluride, zinc telluride, cadmium selenide, mercury selenide, lead selenide, zinc selenide, cadmium sulfide, mercury sulfide, zinc sulfide, lead sulfide, cadmium zinc telluride, cadmium sulfur telluride, cadmium manganese telluride, cadmium magnesium telluride, or combinations thereof.

13. The photovoltaic device of claim 1, further comprising:
a support;
a transparent conductive layer disposed on the support; and
the window layer is disposed on the transparent conductive layer.

14. The photovoltaic device of claim 13, further comprising a back contact layer, wherein the semiconductor layer is interposed between the window layer and the back contact layer, and wherein the second region is disposed proximate to the back contact layer.

15. The photovoltaic device of claim 1, further comprising:
a support;
a back contact layer on the support; and
the semiconductor layer is interposed between the back contact layer and the window layer, wherein the second region is disposed proximate to the back contact layer.

16. A photovoltaic module comprising the photovoltaic device of claim 1.

17. The photovoltaic device of claim 1, wherein the semiconductor layer has a plurality of grain boundaries, wherein a morphology of the plurality of grain boundaries is substantially the same through the semiconductor layer.

18. A photovoltaic device, comprising:
a window layer; and
a semiconductor layer disposed on the window layer, wherein the semiconductor layer comprises a first region and a second region, the first region disposed in a layer proximate to the window layer, and the second region disposed in a layer proximate to the first region, wherein the first region comprises a copper dopant,
the second region comprises a tellurium-rich region and a copper dopant, and
wherein an average atomic concentration of copper in the second region is greater than an average atomic concentration of the copper in the first region.

19. The photovoltaic device of claim 18, wherein an average atomic concentration of copper in the first region is in a range from about $10^{16}$ atoms/cm$^3$ to about $5 \times 10^{17}$ atoms/cm$^3$.

20. The photovoltaic device of claim 18, wherein an atomic concentration of copper in the first region is substantially constant across the thickness of the first region.

21. The photovoltaic device of claim 18, wherein an atomic ratio of tellurium to cadmium in the tellurium-rich region is greater than about 2.

22. The photovoltaic device of claim 18, wherein the tellurium-rich region has a thickness in a range from about 10 nanometers to about 1000 nanometers.

23. The photovoltaic device of claim 18, wherein a ratio of the average atomic concentration of copper in the second region to the average atomic concentration of copper in the first region is greater than about 10.

24. The photovoltaic device of claim 18, wherein the semiconductor layer further comprises iodine, and a concentration of iodine in the semiconductor layer varies across the thickness of the semiconductor layer.

25. The photovoltaic device of claim 18, wherein the semiconductor material comprises cadmium telluride, magnesium telluride, mercury telluride, lead telluride, zinc telluride, cadmium selenide, mercury selenide, lead selenide, zinc selenide, cadmium sulfide, mercury sulfide, zinc sulfide, lead sulfide, cadmium zinc telluride, cadmium sulfur telluride, cadmium manganese telluride, cadmium magnesium telluride, or combinations thereof.

* * * * *